(12) United States Patent
Saito

(10) Patent No.: US 12,431,370 B2
(45) Date of Patent: Sep. 30, 2025

(54) REINFORCEMENT PORTION PROCESSING APPARATUS

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 808 days.

(21) Appl. No.: 17/663,488

(22) Filed: May 16, 2022

(65) Prior Publication Data

US 2022/0384237 A1 Dec. 1, 2022

(30) Foreign Application Priority Data

May 27, 2021 (JP) ................................. 2021-089208

(51) Int. Cl.
*H01L 21/67* (2006.01)
*B23K 26/38* (2014.01)
*H01L 21/683* (2006.01)

(52) U.S. Cl.
CPC ........ *H01L 21/67092* (2013.01); *B23K 26/38* (2013.01); *H01L 21/6836* (2013.01); *H01L 2221/68327* (2013.01)

(58) Field of Classification Search
CPC ........... H01L 21/67092; H01L 21/6836; H01L 2221/68327; H01L 21/67706; H01L 21/67718; H01L 21/67778; H01L 21/681; H01L 21/6838; H01L 21/68707; H01L 21/67132; H01L 21/67766; H01L 21/68742; B23K 26/38; B23K 26/364; H05F 3/06

See application file for complete search history.

(56) References Cited

U.S. PATENT DOCUMENTS

| 2022/0020614 A1* | 1/2022 | Masuda | ............ H01L 21/67132 |
| 2022/0189800 A1* | 6/2022 | Uchiho | ............ H01L 21/67115 |

FOREIGN PATENT DOCUMENTS

| DE | 19856393 A1 | 6/1999 |
| DE | 102013205126 A1 | 10/2013 |
| JP | 2004327613 A | 11/2004 |
| JP | 2010062375 A | 3/2010 |
| JP | 2014056939 A | 3/2014 |
| JP | 2015162555 A | 9/2015 |

OTHER PUBLICATIONS

Office Action issued in counterpart German patent application No. 10 2022 204 940.3, dated Aug. 28, 2024.

* cited by examiner

*Primary Examiner* — John P. Dulka
(74) *Attorney, Agent, or Firm* — Greer Burns & Crain Ltd.

(57) ABSTRACT

A processing apparatus includes a reinforcing portion removing mechanism. The reinforcing portion removing mechanism includes a laser beam irradiating unit configured to form a cutting groove by applying a laser beam to a base of a ring-shaped reinforcing portion formed on a periphery of a wafer, a first raising and lowering table configured to hold and raise a frame unit temporarily placed on a temporary placement table, and position the frame unit at the laser beam irradiating unit, and a separating unit configured to separate the ring-shaped reinforcing portion from the cutting groove. The separating unit includes an ultraviolet ray irradiating unit, a second raising and lowering table, a separator, and a discarding unit.

6 Claims, 20 Drawing Sheets

REINFORCEMENT PORTION PROCESSING APPARATUS

BACKGROUND OF THE INVENTION

Field of the Invention

The present invention relates to a processing apparatus for removing a ring-shaped reinforcing portion in a projecting shape from a wafer having the reinforcing portion formed in a projecting shape on an undersurface part corresponding to a peripheral surplus region.

Description of the Related Art

A wafer having a top surface on which a device region having a plurality of devices such as integrated circuits (ICs) or large-scale integration circuits (LSIs) divided by planned dividing lines and a peripheral surplus region surrounding the device region are formed is formed into a desired thickness by grinding an undersurface of the wafer, and is thereafter divided into individual device chips by a dicing apparatus or a laser processing apparatus. Each of the divided device chips is used in electric equipment such as a mobile telephone or a personal computer.

There has been proposed a technique which makes a ring-shaped reinforcing portion remain on the undersurface part corresponding to the peripheral surplus region in order to facilitate transportation of the ground wafer, performs predetermined processing, thereafter attaches a dicing tape to the undersurface of the wafer and supports the wafer by a frame, and removes the ring-shaped reinforcing portion from the wafer (see Japanese Patent Laid-Open No. 2010-62375, for example).

SUMMARY OF THE INVENTION

However, it is difficult to perform work of integrating the wafer with the frame by attaching the dicing tape to the undersurface of the wafer having the ring-shaped reinforcing portion formed in a projecting shape on the undersurface part corresponding to the peripheral surplus region, and it is difficult to cut the ring-shaped reinforcing portion and remove the ring-shaped reinforcing portion from the wafer. There is thus a problem of poor productivity.

It is accordingly an object of the present invention to provide a processing apparatus which facilitates the work of integrating a wafer with a frame by attaching a dicing tape to an undersurface of the wafer having a ring-shaped reinforcing portion formed in a projecting shape on an undersurface part corresponding to a peripheral surplus region, and easily cuts the ring-shaped reinforcing portion to remove the ring-shaped reinforcing portion from the wafer.

In accordance with an aspect of the present invention, there is provided a processing apparatus for removing a ring-shaped reinforcing portion in a projecting shape from a wafer having the reinforcing portion formed in a projecting shape on an undersurface part corresponding to a peripheral surplus region, the processing apparatus including a wafer cassette table mounted with a wafer cassette housing a plurality of wafers, a wafer unloading mechanism configured to unload the wafer from the wafer cassette mounted on the wafer cassette table, a wafer table configured to support a top surface side of the wafer unloaded by the wafer unloading mechanism, a frame housing mechanism configured to house a plurality of ring-shaped frames in which an opening portion for housing the wafer is formed, a frame unloading mechanism configured to unload a frame from the frame housing mechanism, a frame table configured to support the frame unloaded by the frame unloading mechanism, a tape attaching mechanism disposed above the frame table and configured to attach a tape to the frame, a tape-attached frame transporting mechanism configured to transport the frame to which the tape is attached to the wafer table, position the opening portion of the frame at the undersurface of the wafer supported by the wafer table, and mount the tape-attached frame on the wafer table, a tape compression-bonding mechanism configured to compression-bond the tape of the tape-attached frame to the undersurface of the wafer, a frame unit unloading mechanism configured to unload, from the wafer table, a frame unit in which the tape of the tape-attached frame and the undersurface of the wafer are compression-bonded to each other by the tape compression-bonding mechanism, and temporarily place the frame unit on a temporary placement table, a reinforcing portion removing mechanism configured to cut and remove the ring-shaped reinforcing portion from the wafer of the frame unit mounted on the temporary placement table, a no-ring unit unloading mechanism configured to unload the no-ring unit from which the ring-shaped reinforcing portion is removed from the reinforcing portion removing mechanism, and a frame cassette table mounted with a frame cassette configured to house the no-ring unit unloaded by the no-ring unit unloading mechanism. The reinforcing portion removing mechanism includes a laser beam irradiating unit configured to form a cutting groove by applying a laser beam to a base of the ring-shaped reinforcing portion formed on a periphery of the wafer, a first raising and lowering table configured to hold and raise the frame unit temporarily placed on the temporary placement table, and position the frame unit at the laser beam irradiating unit, and a separating unit configured to separate the ring-shaped reinforcing portion from the cutting groove. The separating unit includes an ultraviolet ray irradiating unit configured to reduce an adhesive force of the tape by irradiating a tape part corresponding to the cutting groove with an ultraviolet ray, a second raising and lowering table configured to suck and hold an inside of the wafer while exposing the ring-shaped reinforcing portion to a periphery of the second raising and lowering table, a separator configured to separate the ring-shaped reinforcing portion by making tops having a wedge act on a periphery of the ring-shaped reinforcing portion, and a discarding unit onto which the separated ring-shaped reinforcing portion is discarded.

Preferably, the second raising and lowering table includes two kinds or more of table heads having an outside diameter corresponding to an inside diameter of the reinforcing portion of the wafer, and a table head is detachably fitted to a raising and lowering mechanism, the separating unit includes a detector configured to detect whether or not a kind of table head input to a control unit coincides with a kind of table head actually fitted, and the detector detects whether or not the outside diameter of the table head which outside diameter is obtained by bringing the tops of the separator into contact with a periphery of the table head coincides with the outside diameter of the table head which outside diameter is input to the control unit. In addition, preferably, the processing apparatus further includes frame supporting units which are adjacent to the tops of the separating unit and support the frame. In addition, preferably, the frame supporting units each have a rotatable spherical body. In addition, preferably, an ionizer is disposed so as to be adjacent to tops of the separating unit, and removes static electricity from the frame unit.

The processing apparatus according to one aspect of the present invention facilitates work of integrating the wafer with the frame by attaching a dicing tape to the undersurface of the wafer having the ring-shaped reinforcing portion formed in a projecting shape on the part of the undersurface which part corresponds to the peripheral surplus region, and facilitates cutting the ring-shaped reinforcing portion and removing the ring-shaped reinforcing portion from the wafer. Excellent productivity is thus achieved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will hereinafter be described in detail with reference to the accompanying drawings.

Figure 1:
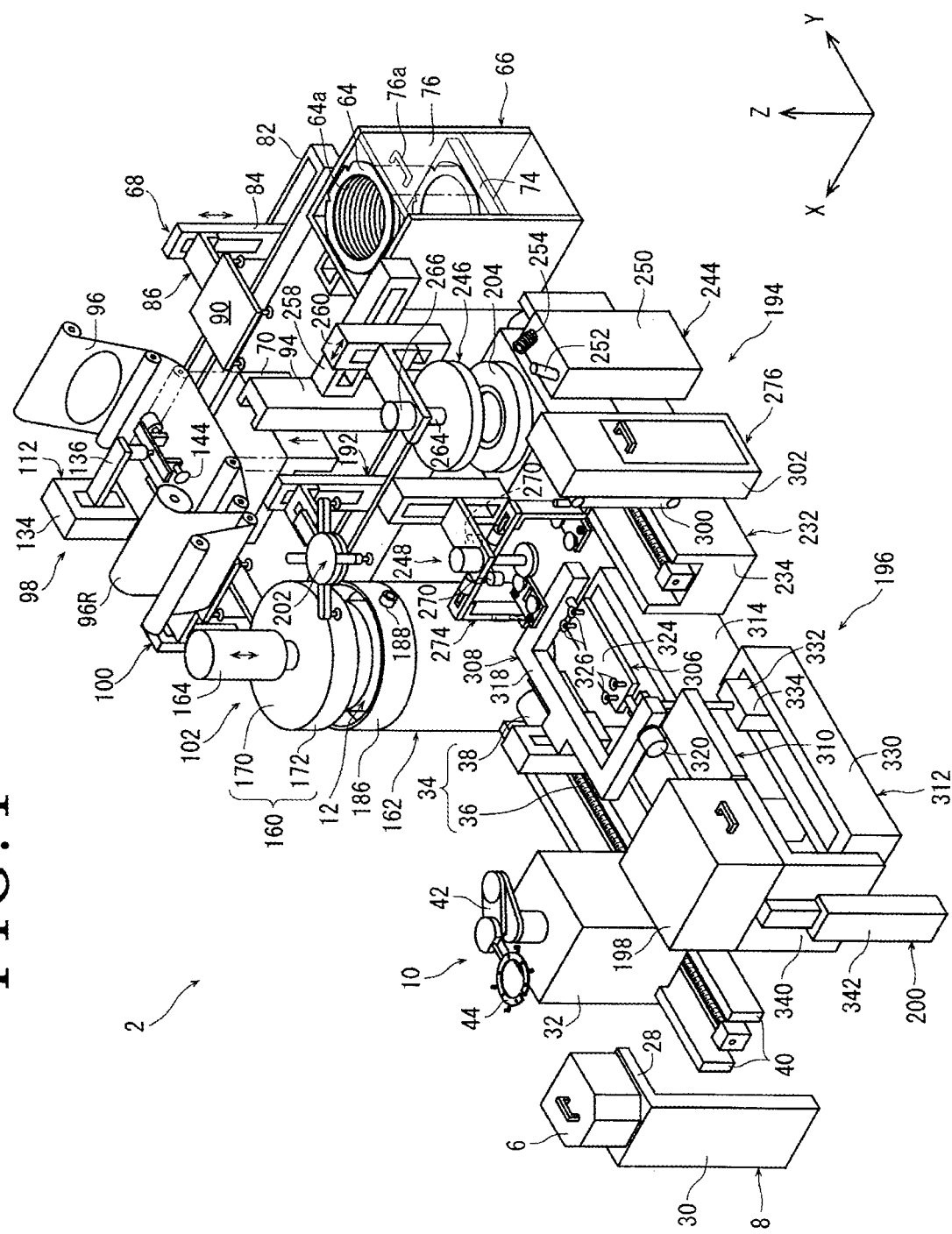
FIG. 1 is a perspective view of a processing apparatus.

Making description with reference to FIG. 1, a processing apparatus 2 according to the present embodiment includes a wafer cassette table 8 mounted with a wafer cassette 6 housing a plurality of wafers, a wafer unloading mechanism 10 that unloads a wafer from the wafer cassette 6 mounted on the wafer cassette table 8, and a wafer table 12 that supports the top surface side of the wafer unloaded by the wafer unloading mechanism 10.

Figure 2:
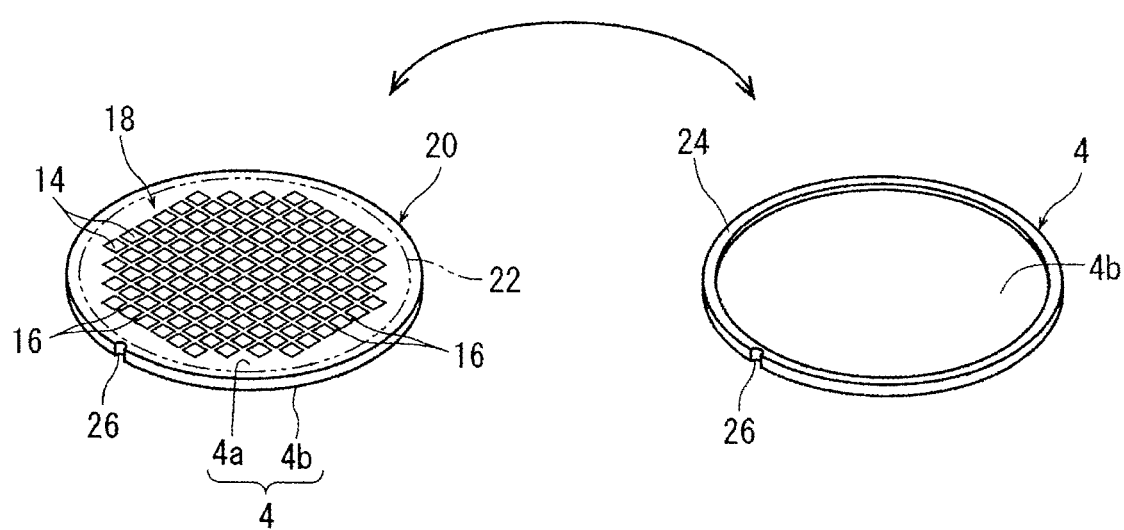
FIG. 2 is a perspective view of a wafer to be processed by the processing apparatus depicted in FIG. 1.

FIG. 2 depicts a wafer 4 to be processed by the processing apparatus 2. Formed on a top surface 4a of the wafer 4 are a device region 18 having thereon a plurality of devices 14 such as ICs or LSIs demarcated by planned dividing lines 16 in a lattice shape and a peripheral surplus region 20 surrounding the device region 18. In FIG. 2, a boundary 22 between the device region 18 and the peripheral surplus region 20 is indicated by a chain double-dashed line for convenience. In actuality, however, the line indicating the boundary 22 is not present. On an undersurface 4b side of the wafer 4, a ring-shaped reinforcing portion 24 is formed in a projecting manner in the peripheral surplus region 20. A thickness of the peripheral surplus region 20 is larger than a thickness of the device region 18. In addition, a notch 26 indicating a crystal orientation is formed in a circumferential edge of the wafer 4.

Figure 3:
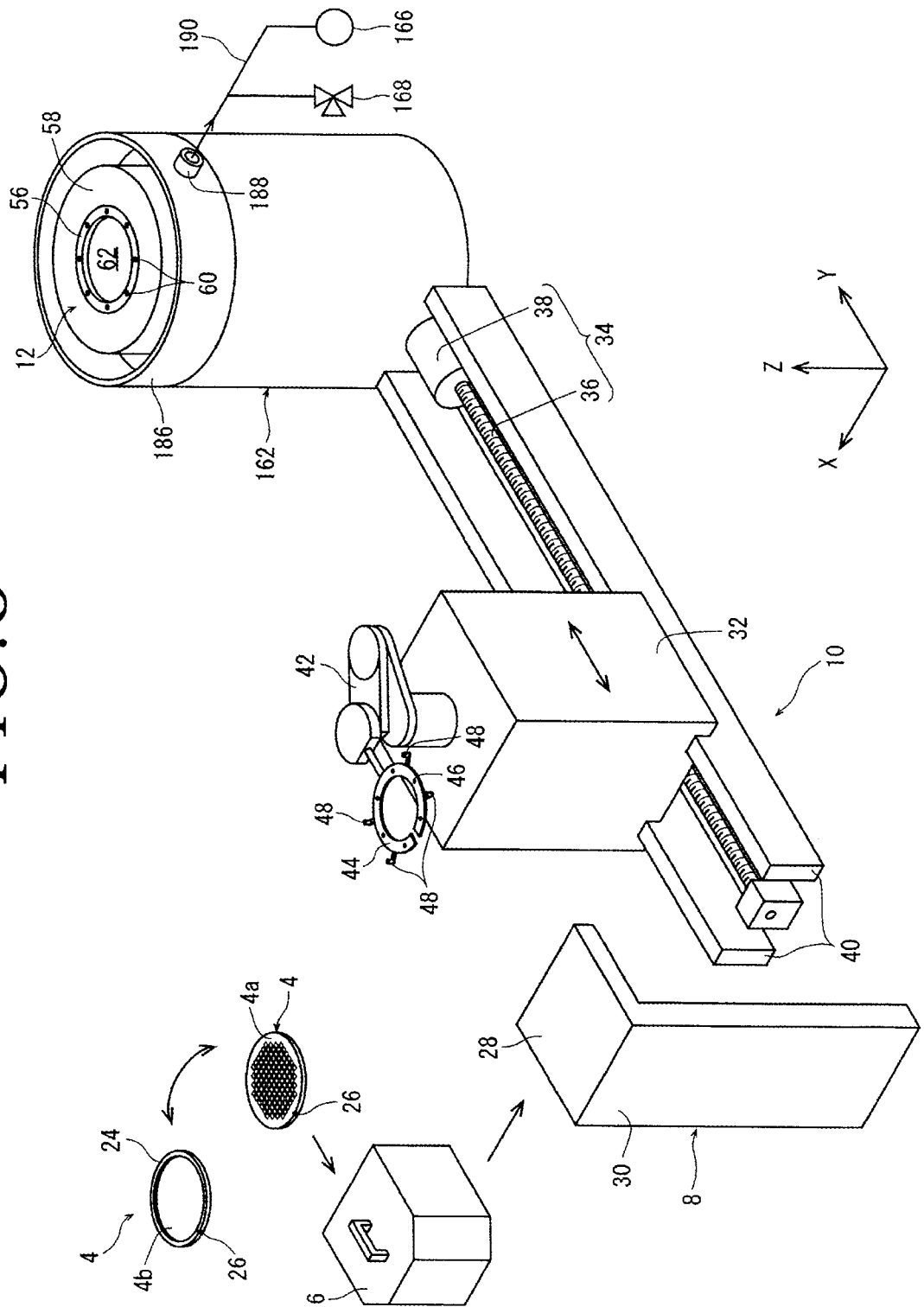
FIG. 3 is a perspective view of a wafer cassette table and the like depicted in FIG. 1.

As depicted in FIG. 3, the wafer cassette 6 houses a plurality of wafers 4 at intervals in an upward-downward direction in a state in which the top surfaces 4a are oriented upward. The wafer cassette table 8 in the embodiment depicted in the figures has a top plate 28 mounted with the wafer cassette 6 and a support plate 30 supporting the top plate 28. Incidentally, the top plate 28 may be freely raised and lowered, and a raising and lowering mechanism for positioning the top plate 28 at any height by raising or lowering the top plate 28 may be provided.

Continuing the description with reference to FIG. 3, the wafer unloading mechanism 10 includes a Y-axis movable member 32 movable in a Y-axis direction indicated by an arrow Y in FIG. 3 and a Y-axis feed mechanism 34 that moves the Y-axis movable member 32 in the Y-axis direction. The Y-axis feed mechanism 34 includes a ball screw 36 coupled to a lower end of the Y-axis movable member 32 and extending in the Y-axis direction and a motor 38 that rotates the ball screw 36. The Y-axis feed mechanism 34 converts rotary motion of the motor 38 into rectilinear motion by the ball screw 36, and transmits the rectilinear motion to the Y-axis movable member 32. The Y-axis feed mechanism 34 thereby moves the Y-axis movable member 32 in the Y-axis direction along a pair of guide rails 40 extending in the Y-axis direction. Incidentally, an X-axis direction indicated by an arrow X in FIG. 3 is a direction orthogonal to the Y-axis direction, and a Z-axis direction indicated by an arrow Z in FIG. 3 is an upward-downward direction orthogonal to the X-axis direction and the Y-axis direction. An XY plane defined by the X-axis direction and the Y-axis direction is substantially horizontal.

As depicted in FIG. 3, the wafer unloading mechanism 10 in the embodiment depicted in the figures includes a transporting arm 42 and a hand 44 that is disposed at a distal end of the transporting arm 42, and which supports the undersurface 4b of the wafer 4 housed in the wafer cassette 6 and inverts the top side and the underside of the wafer 4. The transporting arm 42 is provided on an upper surface of the Y-axis movable member 32, and is driven by an appropriate driving source (not depicted) such as an air driving source or an electric driving source. This driving source drives the transporting arm 42 to position the hand 44 at any position in each of the X-axis direction, the Y-axis direction, and the Z-axis direction, and vertically inverts the hand 44.

Figure 4:
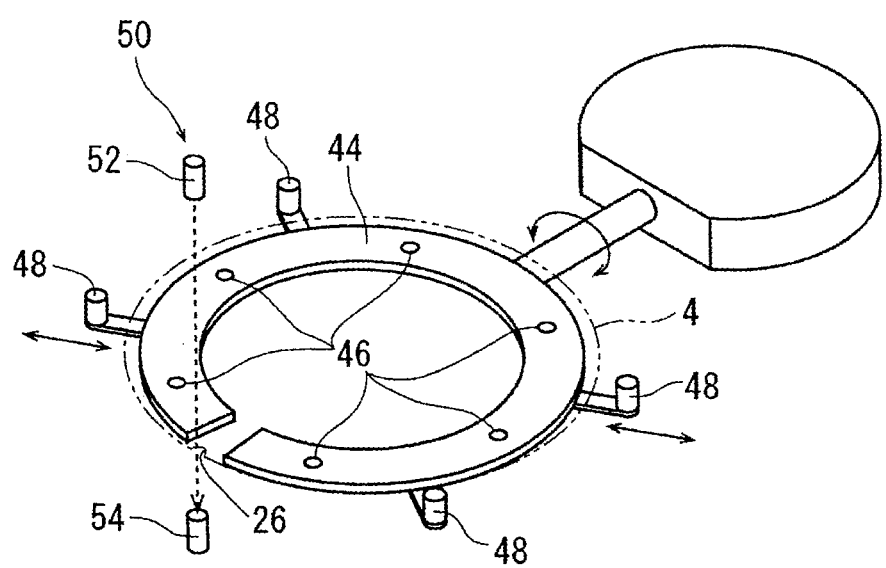
FIG. 4 is a perspective view of a hand depicted in FIG. 1.

Making description with reference to FIG. 4, the hand 44 is preferably a Bernoulli pad that generates a negative pressure by jetting air and thus supports the wafer 4 in a noncontact manner. The hand 44 in the embodiment depicted in the figures is in a C-shape as a whole. A plurality of air jetting ports 46 connected to a compressed air supply source (not depicted) are formed in one surface of the hand 44. A plurality of guide pins 48 are attached to the peripheral edge of the hand 44 at intervals in a circumferential direction. Each guide pin 48 is configured to be movable in the radial direction of the hand 44.

As depicted in FIG. 3 and FIG. 4, the wafer unloading mechanism 10 positions the hand 44 on the undersurface 4b side (lower side) of the wafer 4 in the wafer cassette 6 mounted on the wafer cassette table 8, thereafter generates a negative pressure on one surface side of the hand 44 on the basis of a Bernoulli effect by jetting a compressed air from the air jetting ports 46 of the hand 44, and thus sucks and supports the wafer 4 by the hand 44 on the undersurface 4b side in a noncontact manner. Horizontal movement of the wafer 4 sucked and supported by the hand 44 is regulated by each guide pin 48. Then, the wafer unloading mechanism 10 unloads the wafer 4 sucked and supported by the hand 44 from the wafer cassette 6 by moving the Y-axis movable member 32 and the transporting arm 42.

As depicted in FIG. 4, the wafer unloading mechanism 10 in the embodiment depicted in the figures includes a notch detector 50 that detects the position of the notch 26 of the wafer 4. It suffices for the notch detector 50 to have, for example, a configuration including a light emitting element 52 and a light receiving element 54 arranged at a distance from each other in the upward-downward direction as well as a driving source (not depicted) that rotates at least one of the guide pins 48 of the hand 44.

The light emitting element 52 and the light receiving element 54 can be attached to the Y-axis movable member 32 or a transportation path via appropriate brackets (not depicted). In addition, when the guide pin 48 is rotated by the driving source, the rotation of the guide pin 48 causes a rotation of the wafer 4 sucked and supported by the hand 44. In order to transmit the rotation from the guide pin 48 to the wafer 4 reliably, an outer circumferential surface of the guide pin 48 rotated by the driving source is preferably formed of an appropriate synthetic rubber.

The notch detector 50 can detect the position of the notch 26 by rotating the wafer 4 by the driving source via the guide pin 48 in a state in which the wafer 4 is sucked and supported by the hand 44 and the outer circumference of the wafer 4 is positioned between the light emitting element 52 and the light receiving element 54. Thus, the orientation of the wafer 4 can be adjusted to any orientation.

As depicted in FIG. 3, the wafer table 12 is disposed so as to be adjacent to the wafer unloading mechanism 10. The wafer table 12 in the embodiment depicted in the figures includes an annular supporting portion 56 which supports the peripheral surplus region 20 of the wafer 4 and leaves a part inside the peripheral surplus region 20 in a noncontact state, and a frame supporting portion 58 which is disposed on a periphery of the annular supporting portion 56 and supports a frame 64 (see FIG. 5) to be described later. A plurality of suction holes 60 arranged at intervals in a circumferential direction are formed in an upper surface of the annular supporting portion 56. Each suction hole 60 is connected to a suction source (not depicted). A part radially inward of the annular supporting portion 56 in the wafer table 12 is a circular recess 62 recessed downward.

After the hand 44 inverts the top side and the underside of the wafer 4 by inverting the wafer 4 by 180°, and the wafer 4 is mounted on the wafer table 12 in a state in which the top surface 4a of the wafer 4 is oriented downward, the peripheral surplus region 20 of the wafer 4 is supported by the annular supporting portion 56, and the device region 18 of the wafer 4 is located on the recess 62. Therefore, even when the wafer 4 is mounted on the wafer table 12 in a state in which the top surface 4a having the devices 14 formed thereon is oriented downward, the devices 14 and the wafer table 12 do not come into contact with each other, so that damage to the devices 14 is prevented. In addition, after the wafer table 12 supports the peripheral surplus region 20 by the annular supporting portion 56, the wafer table 12 generates a suction force in each suction hole 60 by actuating the suction source, and thus sucks and holds the peripheral surplus region 20. The wafer table 12 thereby prevents positional displacement of the wafer 4.

Figure 5:
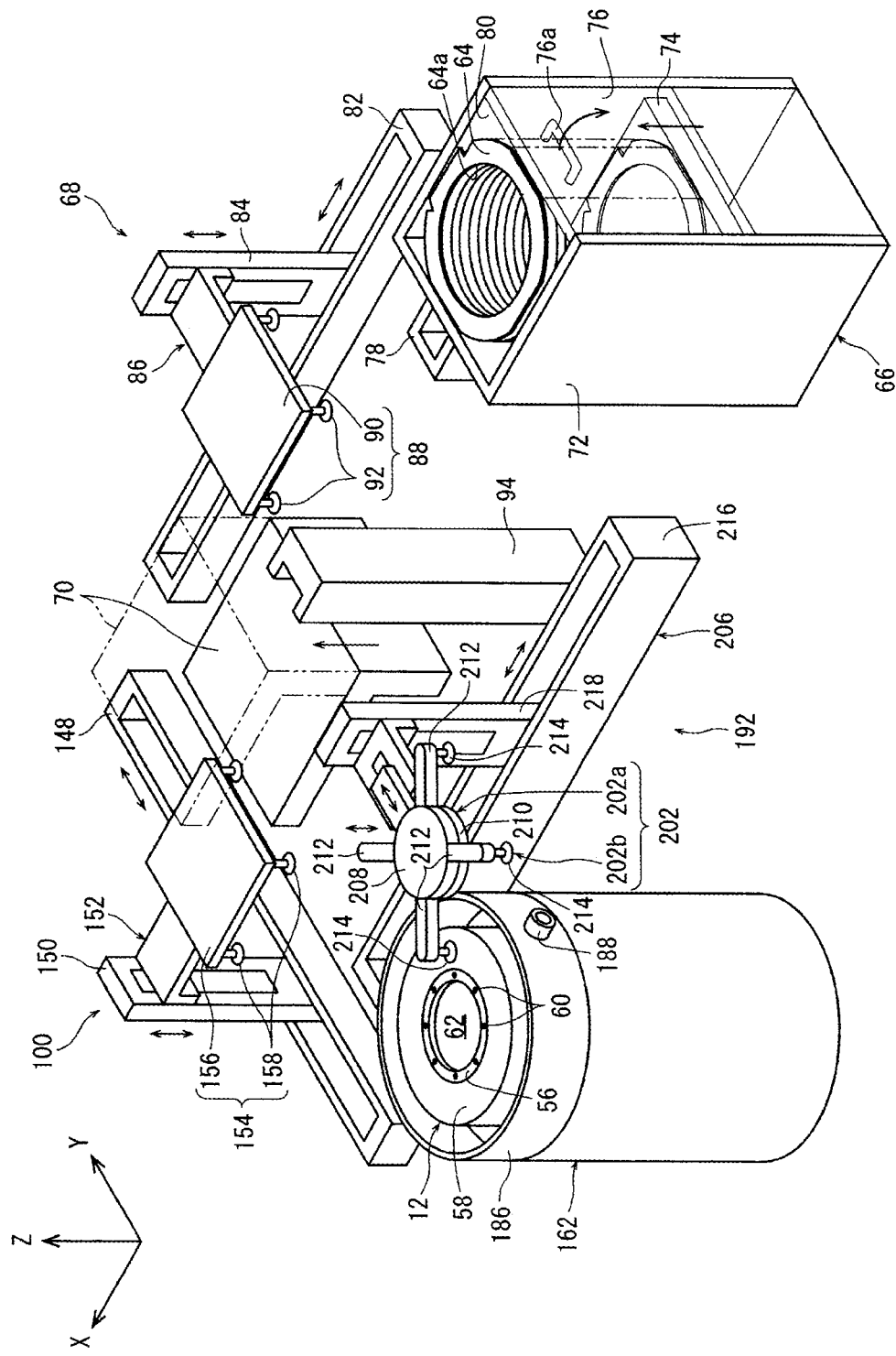
FIG. 5 is a perspective view of a frame housing mechanism and the like depicted in FIG. 1.

Making description with reference to FIG. 5, the processing apparatus 2 further includes a frame housing mechanism 66 that houses a plurality of ring-shaped frames 64 in which an opening portion 64a for housing the wafer 4 is formed, a frame unloading mechanism 68 that unloads a frame 64 from the frame housing mechanism 66, and a frame table 70 that supports the frame 64 unloaded by the frame unloading mechanism 68.

As depicted in FIG. 5, the frame housing mechanism 66 in the embodiment depicted in the figures includes a housing 72, a raising and lowering plate 74 disposed in a vertically movable manner in the housing 72, and a raising and lowering mechanism (not depicted) for raising or lowering the raising and lowering plate 74. A Z-axis guide member 78 extending in the Z-axis direction is disposed on a side surface on a far side in the X-axis direction of the housing 72 in FIG. 5. The raising and lowering plate 74 is supported by the Z-axis guide member 78 in a vertically movable manner. The raising and lowering mechanism for raising or lowering the raising and lowering plate 74 is disposed within the Z-axis guide member 78. It suffices for the raising and lowering mechanism to have, for example, a configuration including a ball screw coupled to the raising and lowering plate 74 and extending in the Z-axis direction and a motor that rotates the ball screw. A door 76 to which a handle 76a is attached is provided to a side surface on a near side in the X-axis direction of the housing 72 in FIG. 5. At the frame housing mechanism 66, when the handle 76a is gripped and the door 76 is opened, frames 64 can be housed in the housing 72. In addition, an opening portion 80 is provided to an upper end of the housing 72.

As depicted in FIG. 5, the frames 64 are housed in the housing 72 so as to be stacked on an upper surface of the raising and lowering plate 74. The frame unloading mechanism 68 unloads a frame 64 at the top of the plurality of stacked frames 64 from the opening portion 80 of the housing 72. In addition, after the frame 64 is unloaded from the opening portion 80, the frame housing mechanism 66 raises the raising and lowering plate 74 by the raising and lowering mechanism as appropriate, and positions a frame 64 at the top in such a position as to be unloadable by the frame unloading mechanism 68.

Continuing the description with reference to FIG. 5, the frame unloading mechanism 68 includes an X-axis guide member 82, an X-axis movable member 84, an X-axis feed mechanism (not depicted), and a Z-axis movable member 86. The X-axis guide member 82 is fixed to an appropriate bracket (not depicted) and extending in the X-axis direction. The X-axis movable member 84 is supported by the X-axis guide member 82 so as to be movable in the X-axis direction. The X-axis feed mechanism moves the X-axis movable member 84 in the X-axis direction. The Z-axis movable member 86 is supported by the X-axis movable member 84 so as to be movable in the Z-axis direction. The Z-axis feed mechanism moves the Z-axis movable member 86 in the Z-axis direction. It suffices for the X-axis feed mechanism of the frame unloading mechanism 68 to have a configuration including a ball screw coupled to the X-axis movable member 84 and extending in the X-axis direction and a motor that rotates the ball screw. It suffices for the Z-axis feed mechanism to have a configuration including a ball screw coupled to the Z-axis movable member 86 and extending in the Z-axis direction and a motor that rotates the ball screw.

The Z-axis movable member 86 of the frame unloading mechanism 68 has a holding unit 88 that holds the frame 64. The holding unit 88 in the embodiment depicted in the figures includes a rectangular board 90 and a plurality of suction pads 92 arranged on a lower surface of the board 90. Each suction pad 92 is connected to a suction source (not depicted).

The frame unloading mechanism 68 sucks and holds the frame 64 at the top which is housed in the frame housing mechanism 66 by the suction pads 92 of the holding unit 88, and thereafter moves the X-axis movable member 84 and the Z-axis movable member 86. The frame unloading mechanism 68 thereby unloads the sucked and held frame 64 at the top from the frame housing mechanism 66.

As depicted in FIG. 5, the frame table 70 is supported by a Z-axis guide member 94 so as to be vertically movable between a lowered position indicated by a solid line and a raised position indicated by a chain double-dashed line. An appropriate driving source (for example, an air driving source or an electric driving source) that raises or lowers the frame table 70 between the lowered position and the raised position is attached to the Z-axis guide member 94. The frame table 70 is configured to receive the frame 64 unloaded by the frame unloading mechanism 68 at the lowered position.

As depicted in FIG. 1 and FIG. 5, the processing apparatus 2 includes a tape attaching mechanism 98 (see FIG. 1), tape-attached frame transporting mechanism 100 (see FIG. 5), and a tape compression-bonding mechanism 102 (see FIG. 1). The tape attaching mechanism 98 is disposed above the frame table 70 and attaches a tape 96 to the frame 64. The tape-attached frame transporting mechanism 100 transports the frame 64 to which the tape 96 is attached (which frame may hereinafter be referred to as a "tape-attached frame 64'") to the wafer table 12, positions the opening portion 64a of the frame 64 at the undersurface 4b of the wafer 4 supported by the wafer table 12, and mounts the tape-attached frame 64' on the wafer table 12. The tape compression-bonding mechanism 102 compression-bonds the tape 96 of the tape-attached frame 64' to the undersurface 4b of the wafer 4.

Figure 6A:
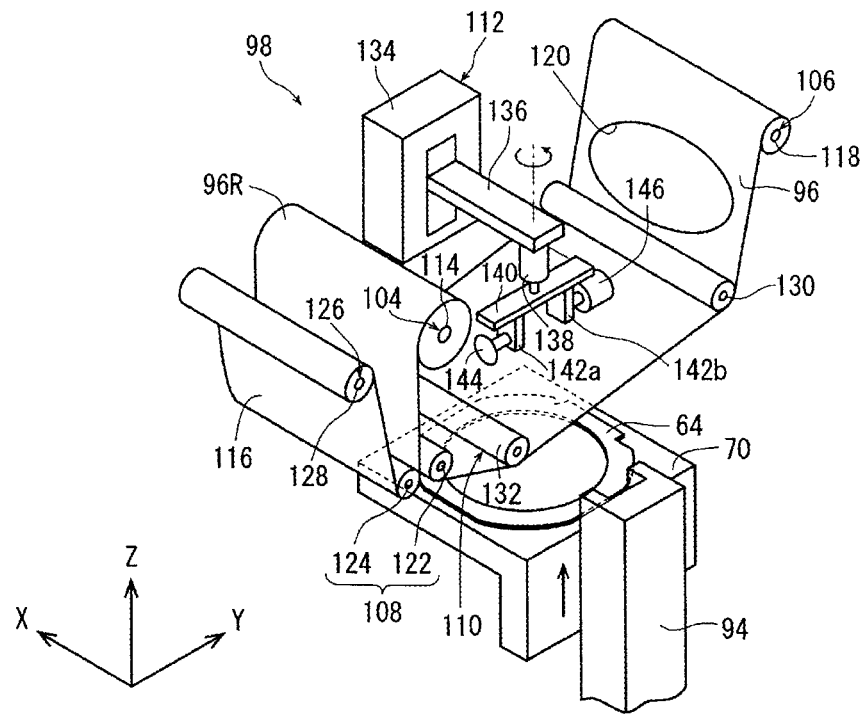
FIG. 6A is a perspective view of a tape attaching mechanism and the like in a state in which a frame table depicted in FIG. 1 is located at a lowered position.
Figure 6B:
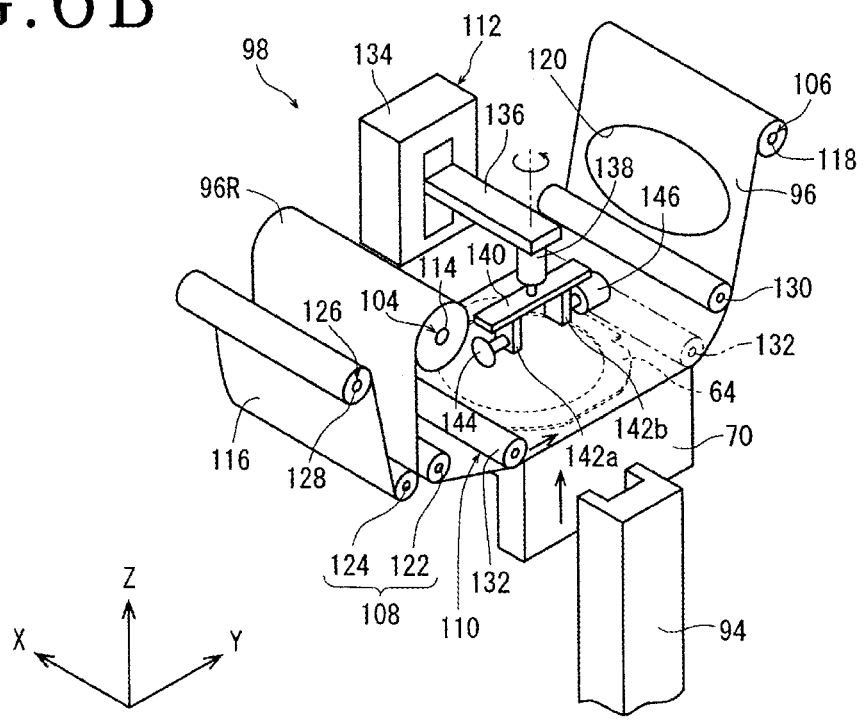
FIG. 6B is a perspective view of the tape attaching mechanism and the like in a state in which the frame table depicted in FIG. 1 is located at a raised position.

Making description with reference to FIG. 6A and FIG. 6B, the tape attaching mechanism 98 in the embodiment depicted in the figures includes a roll tape supporting unit 104 that supports a roll tape 96R wound with the tape 96 before usage, a tape winding unit 106 that winds the tape 96 already used, a tape extracting unit 108 that extracts the tape 96 from the roll tape 96R, a compression bonding unit 110 that compression-bonds the extracted tape 96 to the frame 64, and a cutting unit 112 that cuts the tape 96 extending off the outer circumference of the frame 64 along the frame 64.

As depicted in FIG. 6A and FIG. 6B, the roll tape supporting unit 104 includes a support roller 114 supported by an appropriate bracket (not depicted) so as to be rotatable about an axis extending in the X-axis direction. The support roller 114 supports the roll tape 96R wound in a cylindrical shape such that a peeling paper 116 for protecting the adhesive surface of the tape 96 is attached to the adhesive surface of the tape 96.

The tape winding unit 106 includes a winding roller 118 supported by an appropriate bracket (not depicted) so as to be rotatable about an axis extending in the X-axis direction, and a motor (not depicted) that rotates the winding roller 118. As depicted in FIG. 6A and FIG. 6B, the tape winding unit 106 winds the already used tape 96, in which a circular opening portion 120 corresponding to a part attached to the frame 64 is formed, by rotating the winding roller 118 by the motor.

Continuing the description with reference to FIG. 6A and FIG. 6B, the tape extracting unit 108 includes an extracting roller 122 disposed below the support roller 114 of the roll tape supporting unit 104, a motor (not depicted) that rotates the extracting roller 122, and a driven roller 124 that rotates as the extracting roller 122 rotates. The tape extracting unit 108 extracts the tape 96 sandwiched between the extracting roller 122 and the driven roller 124 from the roll tape 96R by rotating the driven roller 124 together with the extracting roller 122 by the motor.

The peeling paper 116 is peeled off from the tape 96 having passed between the extracting roller 122 and the driven roller 124. The peeled peeling paper 116 is wound by a peeling paper winding unit 126. The peeling paper winding unit 126 in the embodiment depicted in the figures includes a peeling paper winding roller 128 disposed above the driven roller 124, and a motor (not depicted) that rotates the peeling paper winding roller 128. In addition, the tape 96 from which the peeling paper 116 is peeled off is guided to the winding roller 118 via a guide roller 130 disposed at a distance from the extracting roller 122 in the Y-axis direction.

The compression bonding unit 110 includes a pressing roller 132 disposed so as to be movable in the Y-axis direction, and a Y-axis feed mechanism (not depicted) that moves the pressing roller 132 in the Y-axis direction. The Y-axis feed mechanism of the compression bonding unit 110 can be formed by an appropriate driving source (for example, an air driving source or an electric driving source).

As depicted in FIG. 6A and FIG. 6B, the cutting unit 112 includes a Z-axis guide member 134 fixed to an appropriate bracket (not depicted) and extending in the Z-axis direction, a Z-axis movable member 136 supported by the Z-axis guide member 134 so as to be movable in the Z-axis direction, and a Z-axis feed mechanism (not depicted) that moves the Z-axis movable member 136 in the Z-axis direction. It suffices for the Z-axis feed mechanism of the cutting unit 112 to have a configuration including a ball screw coupled to the Z-axis movable member 136 and extending in the Z-axis direction, and a motor that rotates the ball screw.

In addition, the cutting unit 112 includes a motor 138 fixed to a lower surface of a distal end of the Z-axis movable member 136, and an arm piece 140 rotated by the motor 138 about an axis extending in the Z-axis direction. A first and a second suspended piece 142a and 142b are attached to a lower surface of the arm piece 140 at a distance from each other. A circular cutter 144 is supported by the first suspended piece 142a so as to be rotatable about an axis orthogonal to the Z-axis direction. A pressing roller 146 is supported by the second suspended piece 142b so as to be rotatable about an axis orthogonal to the Z-axis direction.

Before the frame table 70 that has received the frame 64 from the frame unloading mechanism 68 is positioned from the lowered position (position depicted in FIG. 6A) to the raised position (position depicted in FIG. 6B), the tape attaching mechanism 98 extracts the tape 96 not yet used by the extracting roller 122 and the driven roller 124. Then, the frame table 70 is positioned at the raised position to such a degree that the pressing roller 132 of the compression bonding unit 110 can press the tape 96 against the frame 64. The frame 64 is brought into contact with the pressing roller 132 via the tape 96. Then, the pressing roller 132 is rolled in the Y-axis direction while the pressing roller 132 presses the adhesive surface of the tape 96 against the frame 64. The tape 96 extracted from the roll tape 96R by the tape extracting unit 108 can thereby be compression-bonded to the frame 64.

After the tape 96 is compression-bonded to the frame 64, the tape attaching mechanism 98 lowers the Z-axis movable member 136 of the cutting unit 112 by the Z-axis feed mechanism, presses the cutter 144 against the tape 96 on the frame 64, and presses the frame 64 from above the tape 96 by the pressing roller 146. Next, the arm piece 140 is rotated by the motor 138, and the cutter 144 and the pressing roller 146 are moved so as to describe a circle along the frame 64. The tape 96 extending off the outer circumference of the frame 64 can thereby be cut along the frame 64. In addition, because the pressing roller 146 presses the frame 64 from above the tape 96, positional displacement of the frame 64 and the tape 96 is prevented while the tape 96 is cut. Then, after the frame table 70 is lowered, the already used tape 96 in which a circular opening portion 120 corresponding to a part attached to the frame 64 is formed is wound by the tape winding unit 106.

As depicted in FIG. 5, the tape-attached frame transporting mechanism 100 includes a Y-axis guide member 148 fixed to an appropriate bracket (not depicted) and extending in the Y-axis direction, a Y-axis movable member 150 supported by the Y-axis guide member 148 so as to be movable in the Y-axis direction, a Y-axis feed mechanism (not depicted) that moves the Y-axis movable member 150 in the Y-axis direction, a Z-axis movable member 152 supported by the Y-axis movable member 150 so as to be movable in the Z-axis direction, and a Z-axis feed mechanism (not depicted) that moves the Z-axis movable member 152 in the Z-axis direction. It suffices for the Y-axis feed mechanism of the tape-attached frame transporting mechanism 100 to have a configuration including a ball screw coupled to the Y-axis movable member 150 and extending in the Y-axis direction and a motor that rotates the ball screw. It suffices for the Z-axis feed mechanism to have a configuration including a ball screw coupled to the Z-axis movable member 152 and extending in the Z-axis direction and a motor that rotates the ball screw.

The Z-axis movable member 152 of the tape-attached frame transporting mechanism 100 has a holding unit 154 that holds the tape-attached frame 64'. The holding unit 154 in the embodiment depicted in the figures includes a rectangular board 156 and a plurality of suction pads 158 provided to a lower surface of the board 156. Each suction pad 158 is connected to a suction source (not depicted).

The tape-attached frame transporting mechanism 100 sucks and holds, by each suction pad 158 of the holding unit 154, an upper surface of the tape-attached frame 64' supported by the frame table 70 in a state in which the adhesive surface of the tape 96 is oriented downward. By moving the Y-axis movable member 150 and the Z-axis movable member 152, the tape-attached frame transporting mechanism 100 transports the tape-attached frame 64' sucked and held by the holding unit 154 from the frame table 70 to the wafer table 12, positions the opening portion 64a of the frame 64 at the undersurface 4b of the wafer 4 supported by the wafer table 12, and mounts the tape-attached frame 64' onto the wafer table 12.

Figure 7:
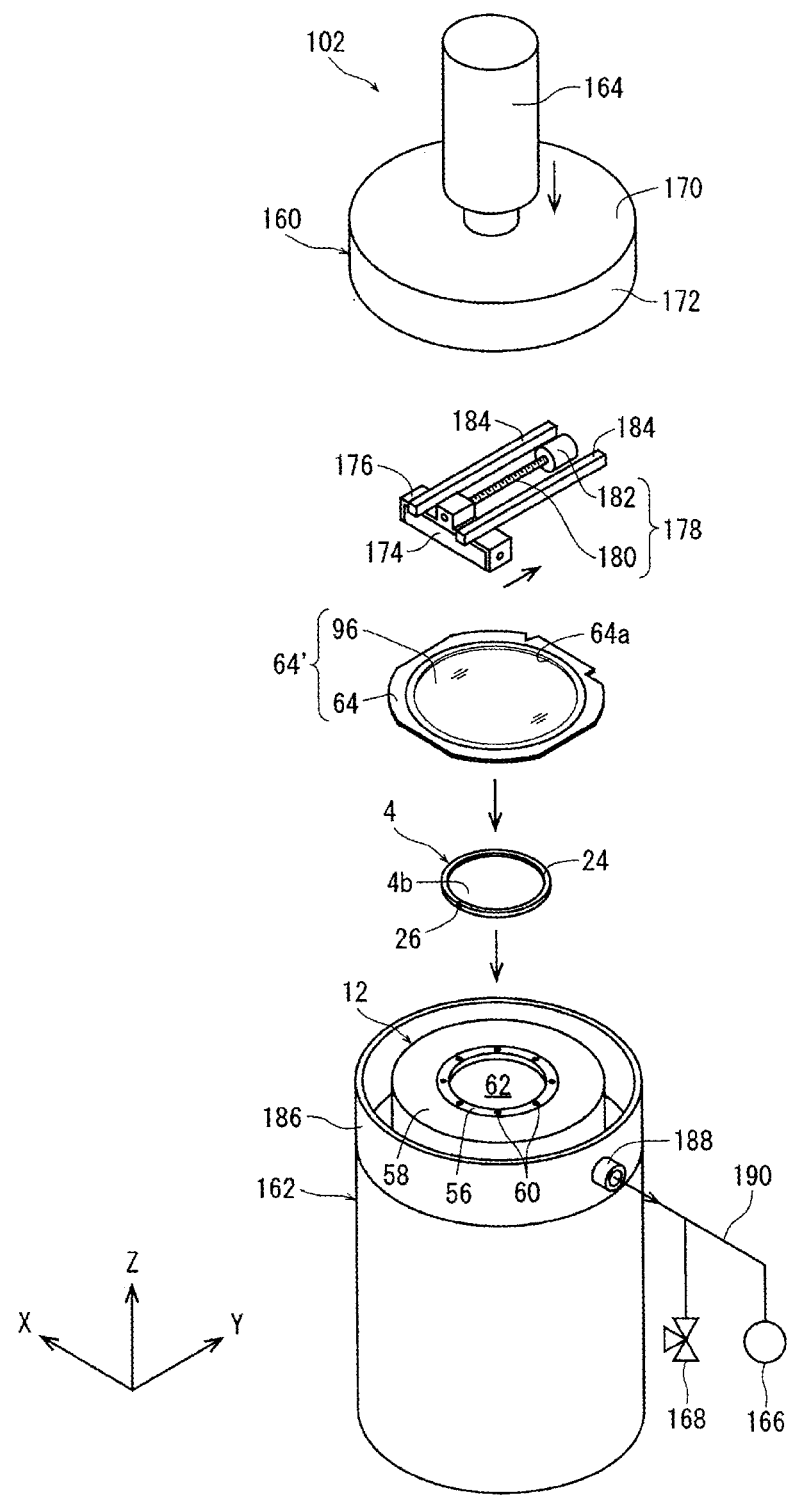
FIG. 7 is an exploded perspective view of a tape compression-bonding mechanism depicted in FIG. 1.

The tape compression-bonding mechanism 102 will be described with reference to FIGS. 7 to 9. As depicted in FIG. 7, the tape compression-bonding mechanism 102 includes an upper chamber 160 disposed above the wafer table 12, a lower chamber 162 that houses the wafer table 12, a raising and lowering mechanism 164 that produces a closed state in which the upper chamber 160 is lowered and set in contact with the lower chamber 162 and an opened state in which the upper chamber 160 is separated from the lower chamber 162, a vacuum unit 166 that evacuates the upper chamber 160 and the lower chamber 162 in the closed state, and an atmosphere opening unit 168 that opens the upper chamber 160 and the lower chamber 162 to the atmosphere.

As depicted in FIG. 7, the upper chamber 160 in the embodiment depicted in the figures includes a circular top 170 and a cylindrical side wall 172 suspended from a circumferential edge of the top 170. The raising and lowering mechanism 164 that can be formed by an appropriate actuator such as an air cylinder is fitted to an upper surface of the top 170. Arranged in a housing space defined by a lower surface of the top 170 and an inner circumferential surface of the side wall 172 are a pressing roller 174 for pressing the tape 96 of the tape-attached frame 64' against the undersurface 4b of the wafer 4 supported by the wafer table 12, a supporting piece 176 that rotatably supports the pressing roller 174, and a Y-axis feed mechanism 178 that moves the supporting piece 176 in the Y-axis direction.

The Y-axis feed mechanism 178 includes a ball screw 180 coupled to the supporting piece 176 and extending in the Y-axis direction and a motor 182 that rotates the ball screw 180. The Y-axis feed mechanism 178 converts rotary motion of the motor 182 into rectilinear motion by the ball screw 180, and transmits the rectilinear motion to the supporting piece 176. The Y-axis feed mechanism 178 thereby moves the supporting piece 176 along a pair of guide rails 184 extending in the Y-axis direction.

As depicted in FIG. 7, the lower chamber 162 has a cylindrical side wall 186. An upper portion of the side wall 186 is opened. A lower portion of the side wall 186 is closed. A connection opening 188 is formed in the side wall 186. A vacuum unit 166 that can be formed by an appropriate vacuum pump is connected to the connection opening 188 via a flow passage 190. The flow passage 190 is provided with the atmosphere opening unit 168 that can be formed by an appropriate valve that can open the flow passage 190 to the atmosphere.

The tape compression-bonding mechanism 102 lowers the upper chamber 160 by the raising and lowering mechanism 164 in a state in which the tape 96 of the tape-attached frame 64' is positioned at the undersurface 4b of the wafer 4 supported by the wafer table 12. The tape compression-bonding mechanism 102 thereby brings a lower end of the side wall 172 of the upper chamber 160 into contact with an upper end of the side wall 186 of the lower chamber 162, sets the upper chamber 160 and the lower chamber 162 in the closed state, and brings the pressing roller 174 into contact with the tape-attached frame 64'.

Next, the tape compression-bonding mechanism 102 evacuates the inside of the upper chamber 160 and the lower chamber 162 by actuating a vacuum pump constituting the vacuum unit 166 in a state in which the valve constituting the atmosphere opening unit 168 is closed. As depicted in FIG. 8 and FIG. 9, the tape compression-bonding mechanism 102 thereafter rolls the pressing roller 174 in the Y-axis direction by the Y-axis feed mechanism 178. The tape compression-bonding mechanism 102 thereby compression-bonds the tape 96 to the undersurface 4b of the wafer 4 to produce a frame unit U.

When the pressing roller 174 compression-bonds the tape 96 to the undersurface 4b of the wafer 4, a small gap is formed between the wafer 4 and the tape 96 at the base of the ring-shaped reinforcing portion 24. However, because the wafer 4 and the tape 96 are compression-bonded to each other in a state in which the inside of the upper chamber 160 and the lower chamber 162 is evacuated, the pressure of the small gap between the wafer 4 and the tape 96 is lower than an atmospheric pressure. When the atmosphere opening unit 168 is opened after the tape 96 is compression-bonded, the atmospheric pressure presses the tape 96 against the wafer 4. Consequently, the gap between the wafer 4 and the tape 96 at the base of the reinforcing portion 24 is eliminated, and the tape 96 closely adheres to the undersurface 4b of the wafer 4 along the base of the reinforcing portion 24.

Figure 10:
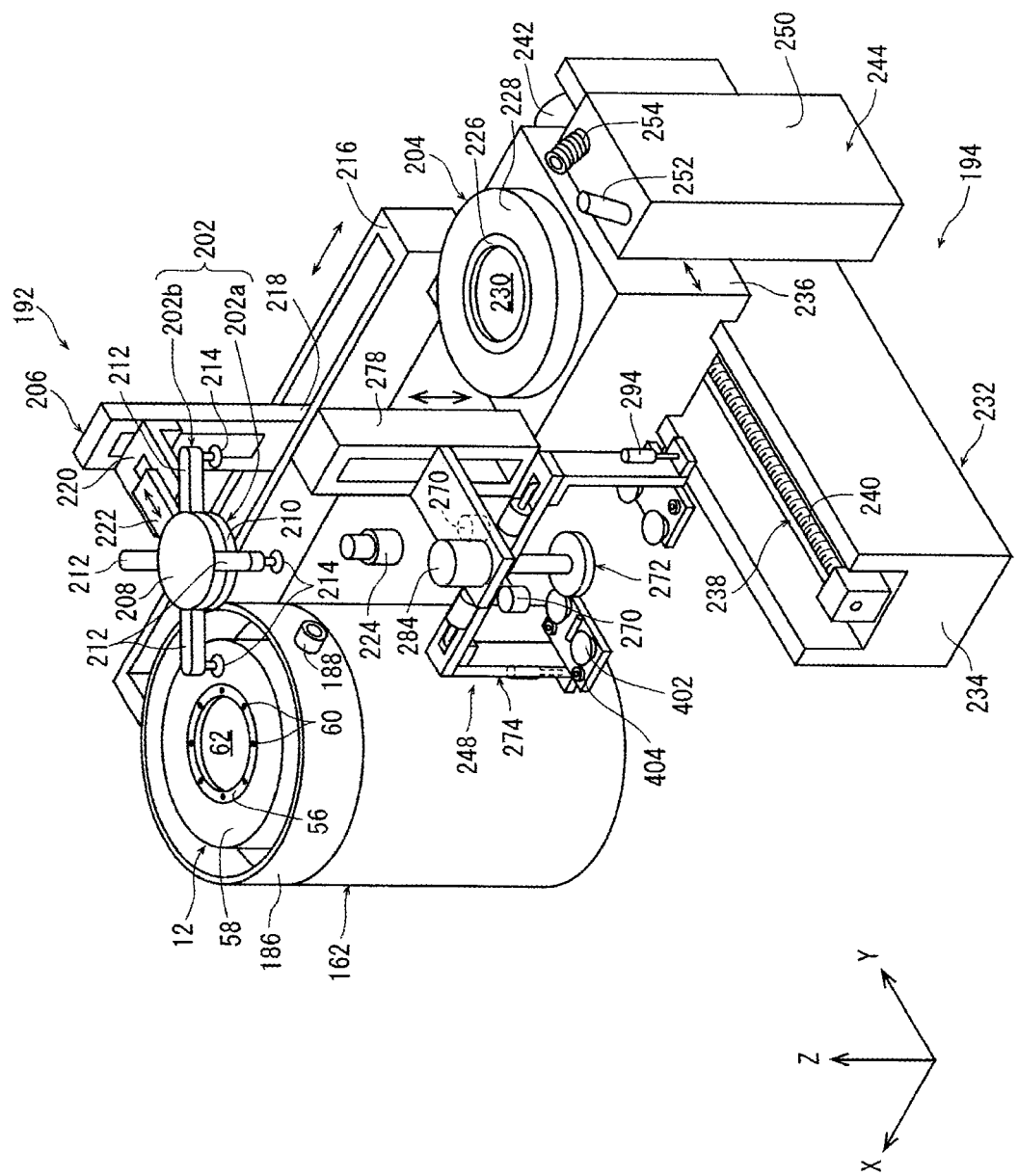
FIG. 10 is a perspective view of a reinforcing portion removing mechanism depicted in FIG. 1.

As depicted in FIG. 1 and FIG. 10, the processing apparatus 2 further includes a frame unit unloading mechanism 192 which unloads the frame unit U, in which the tape 96 of the tape-attached frame 64' and the undersurface 4b of the wafer 4 are compression-bonded to each other by the tape compression-bonding mechanism 102, from the wafer table 12, and temporarily places the frame unit U on a temporary placement table 204, a reinforcing portion removing mechanism 194 which cuts and removes the ring-shaped reinforcing portion 24 from the wafer 4 of the frame unit U placed on the temporary placement table 204, a no-ring unit unloading mechanism 196 (see FIG. 1) that unloads the no-ring unit from which the ring-shaped reinforcing portion 24 is removed, from the reinforcing portion removing mechanism 194, and a frame cassette table 200 (see FIG. 1) mounted with a frame cassette 198 that houses the no-ring unit unloaded by the no-ring unit unloading mechanism 196.

As depicted in FIG. 10, the frame unit unloading mechanism 192 in the embodiment depicted in the figures includes a frame unit holding unit 202 including a wafer holding unit 202a that holds the wafer 4 and a frame holding unit 202b that holds the frame 64, and a transporting unit 206 that transports the frame unit holding unit 202 to the temporary placement table 204.

The wafer holding unit 202a of the frame unit holding unit 202 includes a circular board 208 and a circular suction piece 210 fitted to a lower surface of the board 208. A plurality of suction holes (not depicted) are formed in a lower surface of the suction piece 210. Each suction hole is connected to a suction source (not depicted). The frame holding unit 202b includes a plurality of projecting pieces (four projecting pieces in the embodiment depicted in the figure) 212 projecting radially outward from the peripheral edge of the board 208 of the wafer holding unit 202a at intervals in a circumferential direction and suction pads 214 attached to lower surfaces of the projecting pieces 212. Each suction pad 214 is connected to a suction source (not depicted).

The transporting unit 206 includes an X-axis guide member 216 fixed to an appropriate bracket (not depicted) and extending in the X-axis direction, an X-axis movable member 218 supported by the X-axis guide member 216 so as to be movable in the X-axis direction, an X-axis feed mechanism (not depicted) that moves the X-axis movable member 218 in the X-axis direction, a Z-axis movable member 220 supported by the X-axis movable member 218 so as to be movable in the Z-axis direction, a Z-axis feed mechanism (not depicted) that moves the Z-axis movable member 220 in the Z-axis direction, a Y-axis movable member 222 supported by the Z-axis movable member 220 so as to be movable in the Y-axis direction, and a Y-axis feed mechanism (not depicted) that moves the Y-axis movable member 222 in the Y-axis direction. The board 208 of the wafer holding unit 202a is coupled to a distal end of the Y-axis movable member 222. It suffices for each of the X-axis, Y-axis, and Z-axis feed mechanisms of the transporting unit 206 to have a configuration including a ball screw and a motor that rotates the ball screw.

The frame unit unloading mechanism 192 preferably includes a two-dimensional moving mechanism that two-dimensionally moves the frame unit holding unit 202 in a horizontal direction, and an imaging unit 224 that images a periphery of the wafer 4 of the frame unit U held by the frame unit holding unit 202. In the embodiment depicted in the figure, the X-axis feed mechanism and the Y-axis feed mechanism of the transporting unit 206 two-dimensionally move the frame unit holding unit 202 in the horizontal direction in an XY plane. The two-dimensional moving mechanism is constituted by the transporting unit 206. In addition, the imaging unit 224 in the embodiment depicted in the figures is disposed between the wafer table 12 and the temporary placement table 204, and images the periphery of the wafer 4 of the frame unit U held by the frame unit holding unit 202 from below the wafer 4.

The frame unit unloading mechanism 192 unloads the frame unit U held by the frame unit holding unit 202 from the wafer table 12 by actuating the transporting unit 206 in a state in which the suction piece 210 of the wafer holding unit 202a sucks and holds the wafer 4 from the undersurface 4b side (tape 96 side) and the suction pads 214 of the frame holding unit 202b suck and hold the frame 64.

In addition, the frame unit unloading mechanism 192 in the embodiment depicted in the figures actuates the transporting unit 206 constituting the two-dimensional moving mechanism, and measures the coordinates of at least three points on the periphery of the wafer 4 by imaging, by the imaging unit 224, at least three positions of the periphery of the wafer 4 of the frame unit U held by the frame unit holding unit 202. The frame unit unloading mechanism 192 obtains the central coordinates of the wafer 4 on the basis of the measured coordinates of the three points. Then, the frame unit unloading mechanism 192 makes the center of the wafer 4 coincide with the center of the temporary placement table 204, and temporarily places the frame unit U on the temporary placement table 204.

As depicted in FIG. 10, the temporary placement table 204 is disposed at a distance from the wafer table 12 in the X-axis direction. The temporary placement table 204 in the embodiment depicted in the figures includes an annular supporting portion 226 which supports the peripheral surplus region 20 of the wafer 4 of the frame unit U and leaves a part inside the peripheral surplus region 20 in a noncontact state, and a frame supporting portion 228 which is disposed on a periphery of the annular supporting portion 226 and supports the frame 64.

A part radially inward of the annular supporting portion 226 is a circular recess 230 recessed downward. It is preferable that the frame supporting portion 228 of the temporary placement table 204 include a heater (not depicted), and that the tape 96 be softened by heating the tape 96 of the frame unit U temporarily placed on the temporary placement table 204 by the heater, so that the tape 96 is made to adhere to the base of the ring-shaped reinforcing portion 24 more closely due to the atmospheric pressure.

The processing apparatus 2 in the embodiment depicted in the figures includes a temporary placement table transporting unit 232 that transports the temporary placement table 204 in the Y-axis direction. The temporary placement table transporting unit 232 includes a Y-axis guide member 234 extending in the Y-axis direction, a Y-axis movable member 236 supported by the Y-axis guide member 234 so as to be movable in the Y-axis direction, and a Y-axis feed mechanism 238 that moves the Y-axis movable member 236 in the Y-axis direction. The temporary placement table 204 is fixed to an upper portion of the Y-axis movable member 236. The Y-axis feed mechanism 238 includes a ball screw 240 coupled to the Y-axis movable member 236 and extending in the Y-axis direction and a motor 242 that rotates the ball screw 240. The temporary placement table transporting unit 232 converts rotary motion of the motor 242 into rectilinear motion by the ball screw 240, and transmits the rectilinear motion to the Y-axis movable member 236. The temporary placement table transporting unit 232 thereby transports the temporary placement table 204 in the Y-axis direction together with the Y-axis movable member 236.

As depicted in FIG. 1 and FIG. 10, the reinforcing portion removing mechanism 194 includes a laser beam irradiating unit 244 that forms a cutting groove by applying a laser beam to the base of the ring-shaped reinforcing portion 24 formed on the periphery of the wafer 4, a first raising and lowering table 246 (see FIG. 1) which holds and raises the frame unit U temporarily placed on the temporary placement table 204, and moves the frame unit U in the X-axis direction to be positioned at the laser beam irradiating unit 244, and a separating unit 248 that separates the ring-shaped reinforcing portion 24 from the cutting groove.

As depicted in FIG. 10, the laser beam irradiating unit 244 includes a housing 250 disposed so as to be adjacent to the temporary placement table 204 in the X-axis direction, a laser oscillator (not depicted) that is housed in the housing 250, and generates a laser beam by laser oscillation, a condenser 252 that condenses the laser beam generated by the laser oscillator, and applies the laser beam to the base of the ring-shaped reinforcing portion 24 formed on the periphery of the wafer 4, a suction nozzle 254 that sucks debris produced when the wafer 4 is irradiated with the laser beam, and a suction source (not depicted) connected to the suction nozzle 254.

The condenser 252 extends upward from an upper surface of the housing 250 so as to be inclined to the suction nozzle 254 side. This suppresses falling of the debris produced at the time of application of the laser beam onto the condenser 252. In addition, the suction nozzle 254 extends upward from the upper surface of the housing 250 so as to be inclined to the condenser 252 side.

Figure 11:
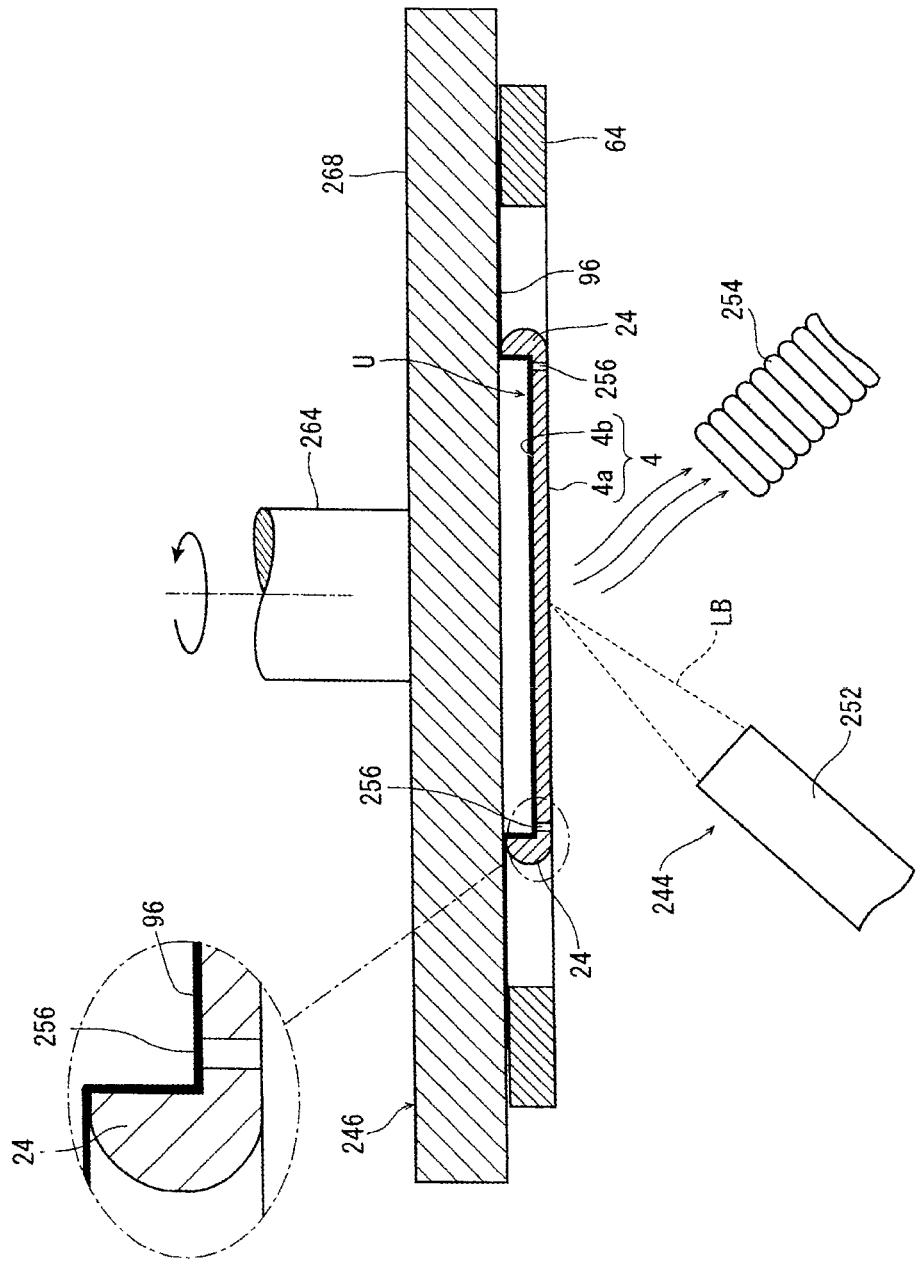
FIG. 11 is a schematic diagram depicting a state in which a base of the wafer is irradiated with a laser beam in a reinforcing portion removing step.

As depicted in FIG. 11, the laser beam irradiating unit 244 applies a laser beam LB to the base of the ring-shaped reinforcing portion 24 formed on the periphery of the wafer 4 while the frame unit U held by the first raising and lowering table 246 is rotated. The laser beam irradiating unit 244 thus forms a ring-shaped cutting groove 256 along the base of the reinforcing portion 24 by ablation processing. In addition, the laser beam irradiating unit 244 sucks the debris produced by the ablation processing by the suction nozzle 254.

As depicted in FIG. 1, the first raising and lowering table 246 is disposed above the temporary placement table 204 so as to be movable in the X-axis direction and movable in the Z-axis direction. Making description with reference to FIG. 12, the first raising and lowering table 246 includes an X-axis guide member 258 fixed to an appropriate bracket (not depicted) and extending in the X-axis direction, an X-axis movable member 260 supported by the X-axis guide member 258 so as to be movable in the X-axis direction, an X-axis feed mechanism (not depicted) that moves the X-axis movable member 260 in the X-axis direction, a Z-axis movable member 262 supported by the X-axis movable member 260 so as to be movable in the Z-axis direction, and a Z-axis feed mechanism (not depicted) that moves the Z-axis movable member 262 in the Z-axis direction. It suffices for each of the X-axis and Z-axis feed mechanisms of the first raising and lowering table 246 to have a configuration including a ball screw and a motor that rotates the ball screw.

A support shaft 264 extending downward is rotatably supported from a lower surface of a distal end of the Z-axis movable member 262. A motor 266 that rotates the support shaft 264 about an axis extending in the Z-axis direction is attached to an upper surface of the distal end of the Z-axis movable member 262. A circular suction piece 268 is fixed to a lower end of the support shaft 264. In a lower surface of the suction piece 268, a plurality of suction holes (not depicted) are formed at intervals in a circumferential direction on a circumference corresponding to the size of the frame 64. Each suction hole is connected to a suction source.

After the suction piece 268 sucks and holds the part of the frame 64 of the frame unit U in which the tape 96 is heated by the heater of the frame supporting portion 228 of the temporary placement table 204 and the tape 96 thus closely adheres to the base of the ring-shaped reinforcing portion 24, the first raising and lowering table 246 raises the frame unit U sucked and held by the suction piece 268 and moves the frame unit U in the X-axis direction by moving the Z-axis movable member 262 and the X-axis movable member 260. The first raising and lowering table 246 thereby positions the frame unit U at the laser beam irradiating unit 244. Incidentally, in a case where the frame 64 is formed of a magnetic material, an electromagnet (not depicted) may be attached to the lower surface of the suction piece 268, and the suction piece 268 may suck the frame 64 by a magnetic force.

In addition, the first raising and lowering table 246 rotates the frame unit U sucked and held by the suction piece 268 by actuating the motor 266 when the laser beam irradiating unit 244 irradiates the wafer 4 with the laser beam LB.

Further, the first raising and lowering table 246 temporarily places the frame unit U in which the cutting groove 256 is formed at the base of the reinforcing portion 24 onto the temporary placement table 204 by moving the frame unit U in the X-axis direction and the Z-axis direction.

As depicted in FIG. 1, the separating unit 248 is disposed at a distance from the first raising and lowering table 246 in the Y-axis direction in a movable range of the temporary placement table 204 in the Y-axis direction. Making description with reference to FIG. 13A, FIG. 13B, and FIG. 14, the separating unit 248 includes ultraviolet ray irradiating units 270 (see FIG. 13A) that reduce the adhesive force of the tape 96 by irradiating a part of the tape 96 which part corresponds to the cutting groove 256 with ultraviolet rays, a second raising and lowering table 272 (see FIG. 13A) that sucks and holds the inside of the wafer 4 while exposing the ring-shaped reinforcing portion 24 to a periphery of the second raising and lowering table 272, a separator 274 (see FIG. 13A) that separates the ring-shaped reinforcing portion 24 by making tops 402 having a wedge act on a periphery of the ring-shaped reinforcing portion 24, and a discarding unit 276 (see FIG. 14) onto which the separated ring-shaped reinforcing portion 24 is discarded.

Figure 13A:
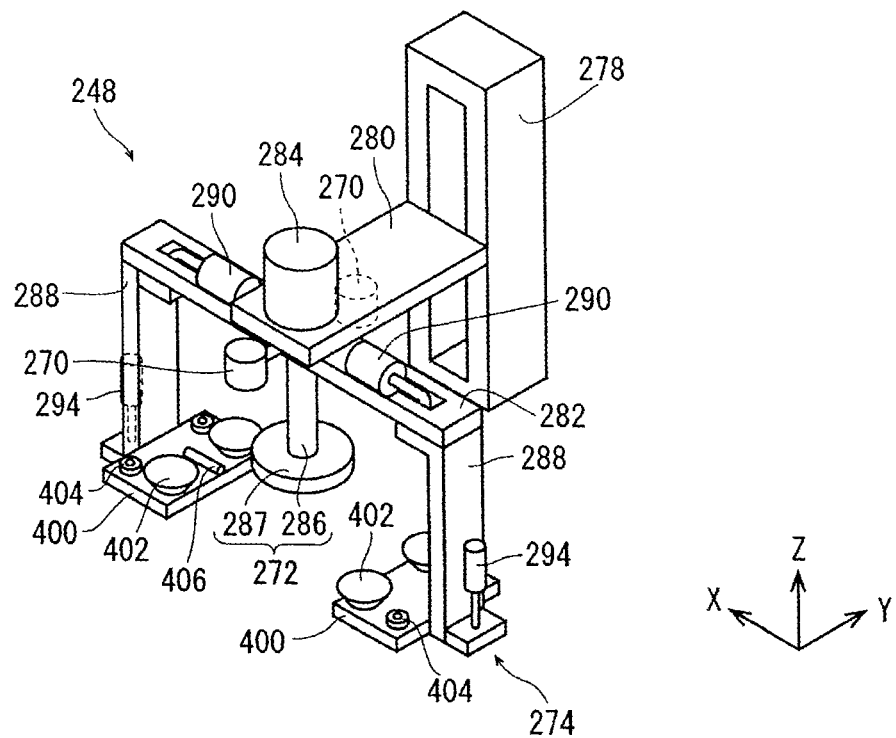
FIG. 13A is a perspective view of a separating unit of the reinforcing portion removing mechanism depicted in FIG. 1.

As depicted in FIG. 13A, the separating unit 248 in the embodiment depicted in the figures includes a Z-axis guide member 278 fixed to an appropriate bracket (not depicted) and extending in the Z-axis direction, a Z-axis movable member 280 supported by the Z-axis guide member 278 so as to be movable in the Z-axis direction, and a raising and lowering mechanism (not depicted) that moves the Z-axis movable member 280 in the Z-axis direction. It suffices for the raising and lowering mechanism to have a configuration including a ball screw coupled to the Z-axis movable member 280 and extending in the Z-axis direction and a motor that rotates the ball screw.

A lower surface of a distal end of the Z-axis movable member 280 supports a support piece 282, and rotatably supports the second raising and lowering table 272. A motor 284 that rotates the second raising and lowering table 272 is attached to an upper surface of the distal end of the Z-axis movable member 280. A pair of the above-described ultraviolet ray irradiating units 270 is attached to the support piece 282 in the embodiment depicted in the figures at a distance from each other in the Y-axis direction.

The second raising and lowering table 272 includes a support shaft 286 extending downward from the lower surface of the distal end of the Z-axis movable member 280 and a circular table head 287 detachably fitted to a lower end of the support shaft 286. A plurality of suction holes (not depicted) are formed in a lower surface of the table head 287. Each suction hole is connected to a suction source.

The table head 287 has an outside diameter corresponding to an inside diameter of the reinforcing portion 24 of the wafer 4. Specifically, a diameter of the table head 287 is slightly smaller than a diameter of the device region 18 of the wafer 4. In addition, the table head 287 is detachably fitted to the support shaft 286, and can be replaced according to a diameter of the wafer 4. The support shaft 286 fitted with the table head 287 is connected to a raising and lowering mechanism of the separating unit 248 via the Z-axis movable member 280. Thus, the second raising and lowering table 272 includes two kinds or more of table heads 287 having an outside diameter corresponding to the inside diameter of the reinforcing portion 24 of the wafer 4. The table head 287 is detachably fitted to the raising and lowering mechanism of the separating unit 248.

In addition, the above-described separator 274 is fitted to the support piece 282. The separator 274 includes a pair of movable pieces 288 arranged on a lower surface of the support piece 282 at a distance from each other so as to be movable in the longitudinal direction of the support piece 282, a pair of feed mechanisms 290 that move the pair of movable pieces 288, a pair of supporting boards 400 supported by the respective movable pieces 288 in a vertically movable manner, and a pair of Z-axis feed mechanisms 294 that raise and lower the pair of supporting boards 400 in the Z-axis direction. Each of the pair of feed mechanisms 290 and the Z-axis feed mechanisms 294 can be formed by an appropriate actuator such as an air cylinder or an electric cylinder.

Figure 13B:
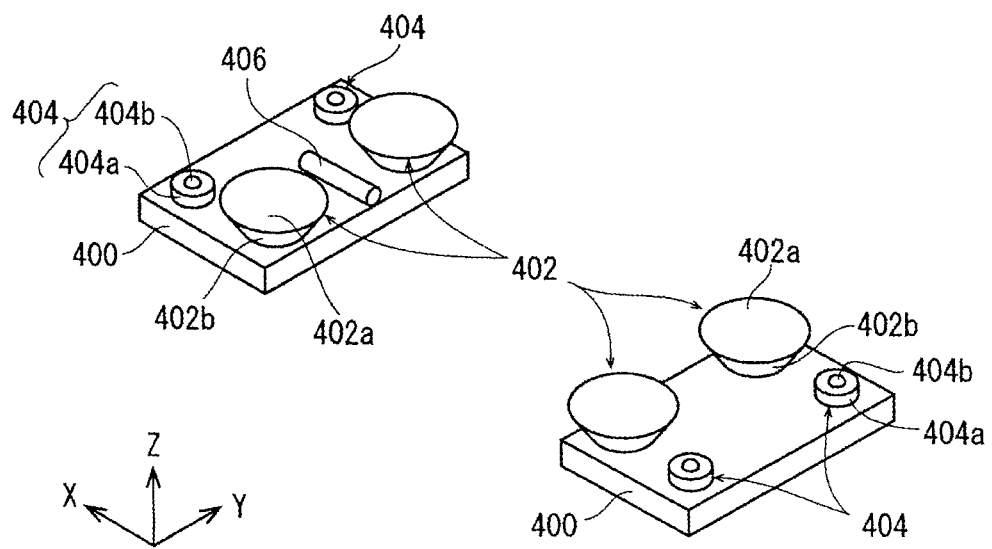
FIG. 13B is an enlarged perspective view of supporting boards depicted in FIG. 13A.

Continuing the description with reference to FIG. 13A and FIG. 13B, an upper surfaces of the respective supporting boards 400 are fitted with tops 402 having a wedge, frame supporting units 404 supporting the frame 64, and an ionizer 406 for removing static electricity from the frame unit U.

The tops 402 have an inverted circular truncated cone shape whose diameter gradually decreases from an upper side to a lower side. Wedges are formed by upper surfaces 402*a* of the tops 402 and side surfaces 402*b* of the tops 402. A pair of tops 402 is arranged on an upper surface of each supporting board 400 at a distance from each other, and is supported by the supporting board 400 so as to be rotatable about an axis extending in the Z-axis direction.

A pair of frame supporting units 404 is arranged on the upper surface of each of the supporting boards 400 so as to be adjacent to the tops 402. The frame supporting units 404 include a housing 404*a* fixed to the supporting board 400 and a spherical body 404*b* rotatably supported by the housing 404*a*. The frame supporting units 404 support the frame 64 by the respective spherical bodies 404*b*.

The ionizer 406 is disposed so as to be adjacent to tops 402. The ionizer 406 removes static electricity from the frame unit U by blowing an ionized air to the frame unit U.

The separating unit 248 in the embodiment depicted in the figures includes a detector (not depicted) that detects whether or not the kind of the table head 287 which kind is input to a control unit (not depicted) that controls the operation of the processing apparatus 2 coincides with the kind of the table head 287 actually fitted in the processing apparatus 2.

The control unit is constituted by a computer including a central processing unit (CPU) that performs arithmetic processing according to a control program, a read-only memory (ROM) that stores the control program and the like, and a readable and writable random access memory (RAN) that stores an arithmetic result and the like. Processing conditions such as the diameter of the wafer 4, the width of the reinforcing portion 24, and the outside diameter of the table head 287 are input to the control unit by an operator.

Figure 15:
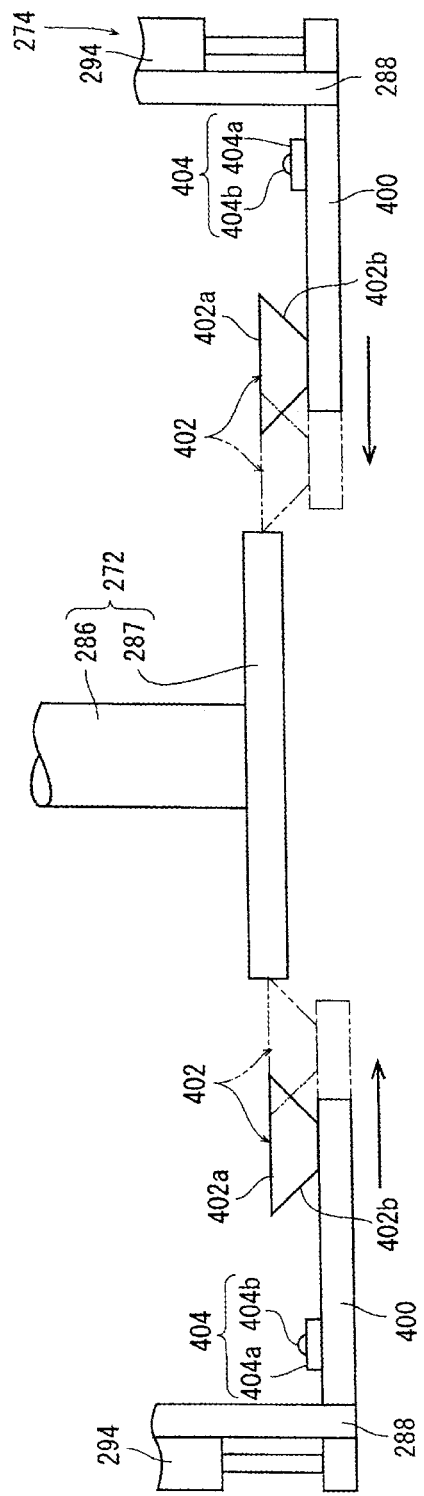
FIG. 15 is a schematic diagram depicting a state in which an outside diameter of a table head depicted in FIG. 1 is detected by bringing tops into contact with the table head.

The detector in the embodiment depicted in the figures includes the tops 402 of the separator 274 as well as the feed mechanisms 290 that bring the tops 402 close to and away from the table head 287 by actuating the movable pieces 288. Before the processing of the wafer 4 is started, the detector actuates the movable pieces 288 by the feed mechanisms 290, and detects whether or not the outside diameter of the table head 287 which outside diameter is obtained by bringing the tops 402 of the separator 274 into contact with a periphery of the table head 287, as depicted in FIG. 15, coincides with the outside diameter of the table head 287 which outside diameter is input to the control unit. When the detector detects that the outside diameters do not coincide with each other, an error notification (for example, display to the effect that the outside diameters do not coincide with each other) is made on a control panel (not depicted).

Even when a plurality of wafers 4 have a same diameter of 200 mm, for example, the ring-shaped reinforcing portions 24 may have different widths of 3 mm, 5 mm, and the like. Therefore, a table head 287 corresponding to the device region 18 of the wafer 4 needs to be fitted in the processing apparatus 2. When the kind of the table head 287 which kind is input to the control unit does not coincide with the kind of the actually fitted table head 287, the ring-shaped reinforcing portion 24 cannot be removed from the wafer 4 properly.

In this respect, the processing apparatus 2 in embodiment depicted in the figures includes a detector that detects whether or not the kind of the table head 287 which kind is input to the control unit coincides with the kind of the table head 287 actually fitted in the processing apparatus 2. It is therefore possible to check whether or not an appropriate table head 287 corresponding to the wafer 4 is fitted before the processing of the wafer 4 is started. Thus, the ring-shaped reinforcing portion 24 can be removed from the wafer 4 properly at a time of the processing of the wafer 4.

Figure 14:
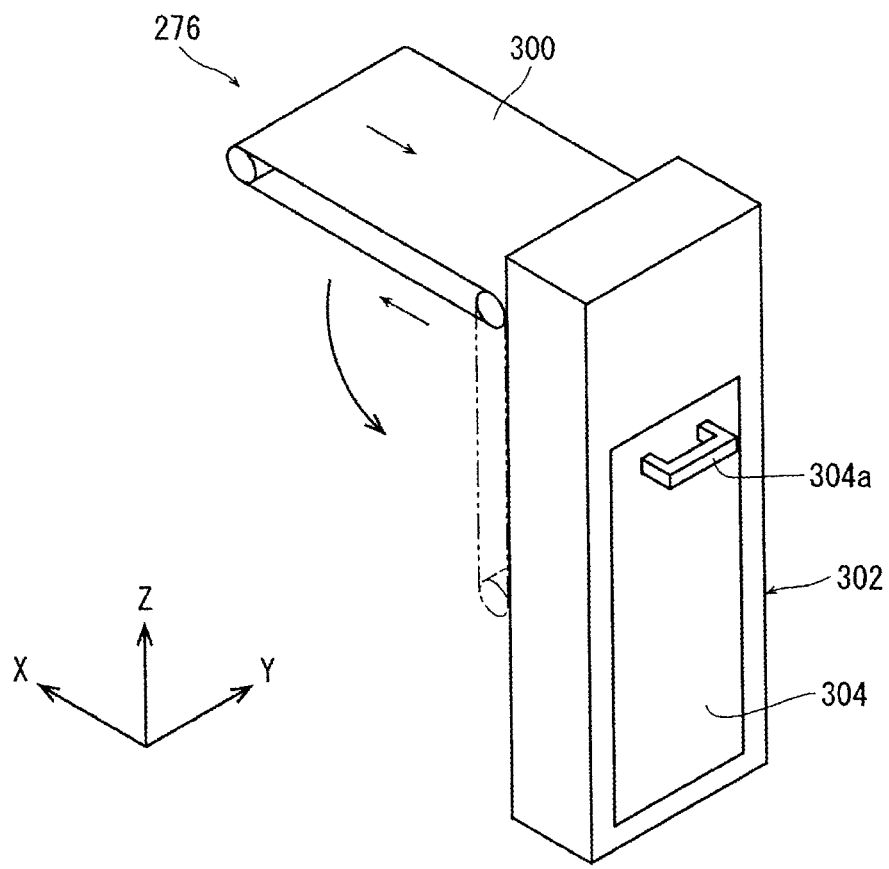
FIG. 14 is a perspective view of a discarding unit of the reinforcing portion removing mechanism depicted in FIG. 1.

Making description with reference to FIG. 14, the discarding unit 276 includes a belt conveyor 300 that transports the separated ring-shaped reinforcing portion 24 and a dust box 302 that houses the ring-shaped reinforcing portion 24 transported by the belt conveyor 300. The belt conveyor 300 is positioned by an appropriate actuator (not depicted) at a collecting position at which the belt conveyor 300 extends substantially horizontally (position indicated by a solid line in FIG. 14) and a standby position at which the belt conveyor 300 extends substantially vertically (position indicated by a chain double-dashed line in FIG. 14).

A door 304 to which a handle 304a is attached is provided to a side surface on a near side in the X-axis direction of the dust box 302 in FIG. 14. A crusher (not depicted) that crushes the collected ring-shaped reinforcing portion 24 is attached to the inside of the dust box 302. The dust box 302 allows crushed waste of the ring-shaped reinforcing portion 24 housed in the dust box 302 to be extracted when the handle 304a is gripped and the door 304 is opened.

Figure 16:
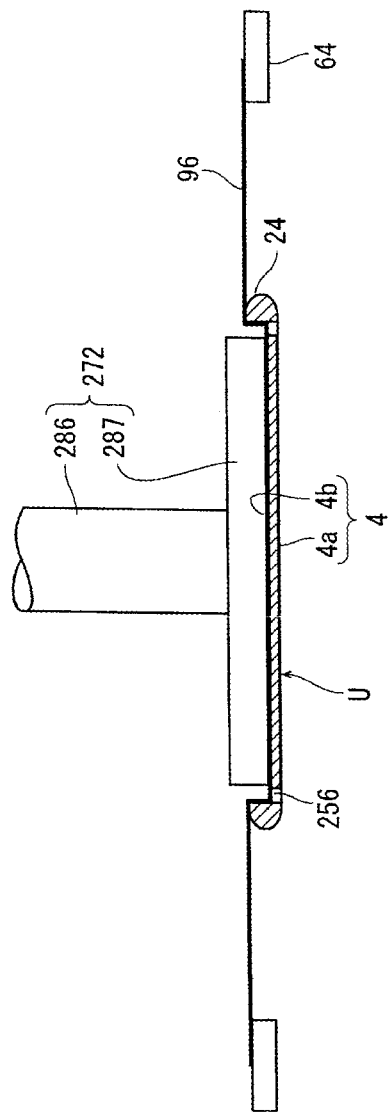
FIG. 16 is a schematic diagram depicting a state in which a second raising and lowering table sucks and holds the wafer in the reinforcing portion removing step.
Figure 17:
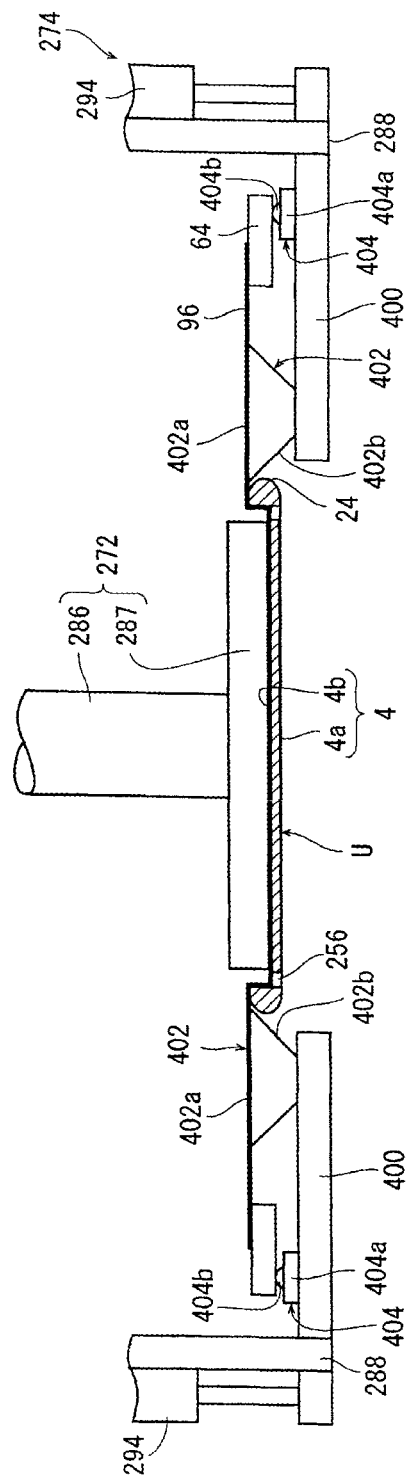
FIG. 17 is a schematic diagram depicting a state in which the tops of the reinforcing portion removing mechanism are made to act on a periphery of a ring-shaped reinforcing portion in the reinforcing portion removing step.

When the temporary placement table 204 on which the frame unit U having the cutting groove 256 formed at the base of the reinforcing portion 24 is temporarily placed is positioned below the separating unit 248 by the temporary placement table transporting unit 232, as depicted in FIG. 16, the separating unit 248 sucks and holds the inside of the wafer 4 by the second raising and lowering table 272 with the ring-shaped reinforcing portion 24 exposed on the periphery. Next, as depicted in FIG. 17, the tops 402 having wedges are made to act on the periphery of the ring-shaped reinforcing portion 24 by moving the movable pieces 288 by the feed mechanisms 290 and moving the supporting boards 400 by the Z-axis feed mechanisms 294. Specifically, the wedges of the tops 402 are positioned between the tape 96 and the reinforcing portion 24. In addition, a lower surface of the frame 64 is brought into contact with the spherical bodies 404b of the frame supporting units 404, and thus the spherical bodies 404b support the frame 64.

Figure 18:
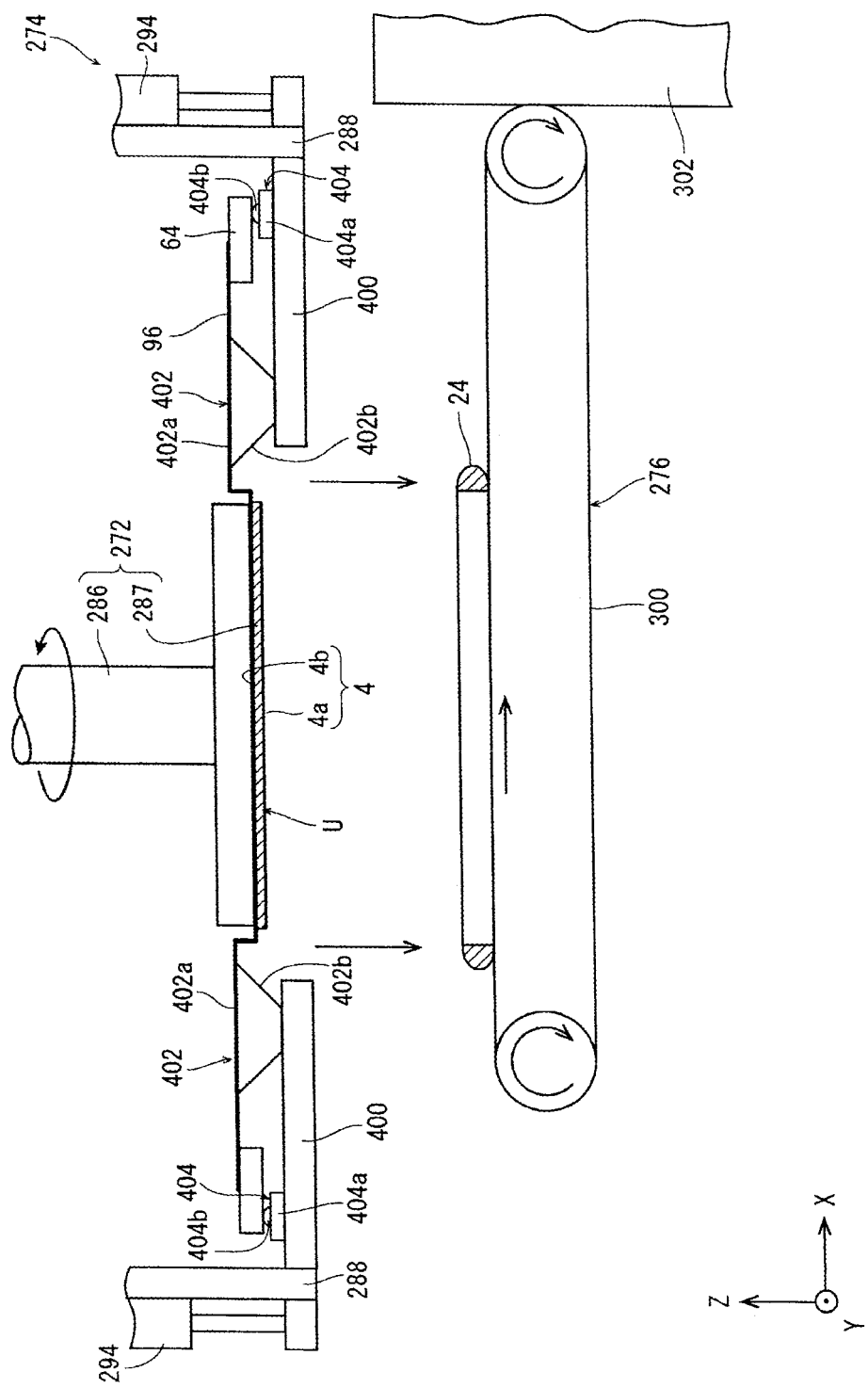
FIG. 18 is a schematic diagram depicting a state in which the reinforcing portion is separated from the wafer in the reinforcing portion removing step.

Next, the adhesive force of the tape 96 adhering to the ring-shaped reinforcing portion 24 is reduced by applying ultraviolet rays from the pair of ultraviolet ray irradiating units 270, and the motor 284 rotates the frame unit U together with the second raising and lowering table 272 with respect to the separator 274. Consequently, the wedges of the tops 402 separate the tape 96 whose adhesive force is reduced and the reinforcing portion 24 from each other, so that, as depicted in FIG. 18, the ring-shaped reinforcing portion 24 can be separated from the frame unit U. The separated reinforcing portion 24 is transported and collected into the dust box 302 by the belt conveyor 300. Incidentally, the separator 274 may be rotated with respect to the frame unit U when the reinforcing portion 24 is separated.

In addition, when the reinforcing portion 24 is separated, an ionized air is blown from the ionizer 406 to the frame unit U. Consequently, even when static electricity is caused by contact of the tops 402 with the tape 96 and the reinforcing portion 24, the ionized air blown from the ionizer 406 removes the static electricity. The reinforcing portion 24 is therefore reliably separated from the frame unit U without the tape 96 and the reinforcing portion 24 being attracted to each other due to the static electricity.

Incidentally, when the reinforcing portion 24 is separated, the tops 402 acting on the frame unit U rotate and the spherical bodies 404b in contact with the lower surface of the frame 64 rotate with relative rotation of the frame unit U and the separator 274. The relative rotation of the frame unit U and the separator 274 is therefore performed smoothly.

As depicted in FIG. 1, the no-ring unit unloading mechanism 196 is disposed so as to be adjacent to the reinforcing portion removing mechanism 194. Making description with reference to FIG. 19 and FIG. 20, the no-ring unit unloading mechanism 196 in the embodiment depicted in the figures includes an inverting mechanism 308 (see FIG. 19) which includes a frame holding unit 306 that faces the no-ring unit supported by the second raising and lowering table 272 and holds the frame 64, and which mechanism moves toward the frame cassette table 200 and inverts the frame holding unit 306, a no-ring unit supporting unit 310 (see FIG. 20) that supports the no-ring unit inverted by the inverting mechanism 308 such that the top surface 4a of the wafer 4 is oriented upward, and a push-in unit 312 (see FIG. 20) which advances and houses the no-ring unit supported by the no-ring unit supporting unit 310 into the frame cassette 198 mounted on the frame cassette table 200.

Figure 19:
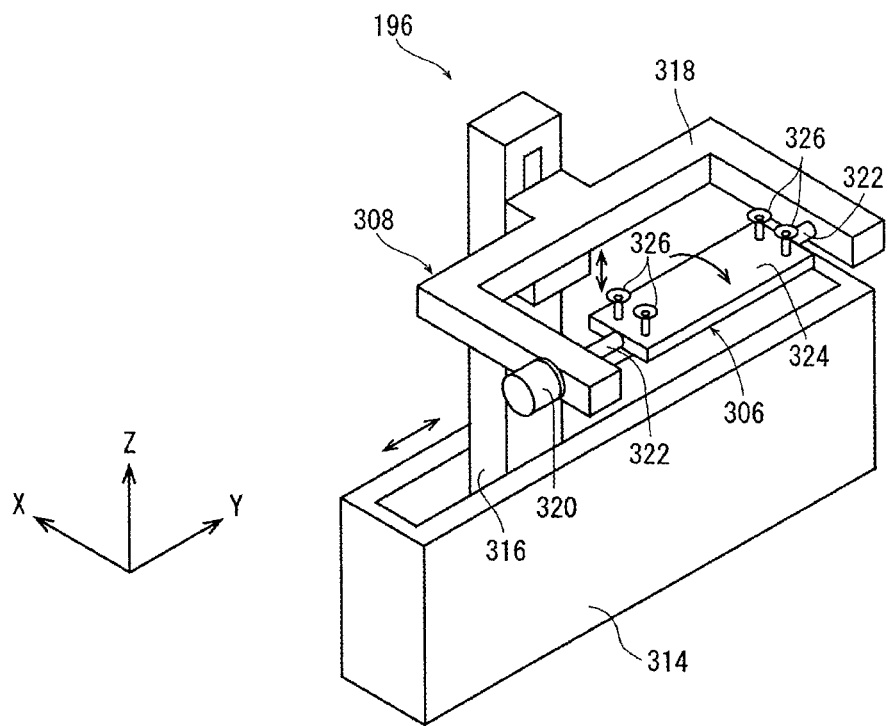
FIG. 19 is a perspective view of an inverting mechanism of a no-ring unit unloading mechanism depicted in FIG. 1.

As depicted in FIG. 19, the inverting mechanism 308 includes a Y-axis guide member 314 extending in the Y-axis direction, a Y-axis movable member 316 supported by the Y-axis guide member 314 so as to be movable in the Y-axis direction, a Y-axis feed mechanism (not depicted) that moves the Y-axis movable member 316 in the Y-axis direction, an arm 318 supported by the Y-axis movable member 316 so as to be movable in the Z-axis direction, and a Z-axis feed mechanism (not depicted) that moves the arm 318 in the Z-axis direction. It suffices for each of the Y-axis and Z-axis feed mechanisms of the inverting mechanism 308 to have a configuration including a ball screw and a motor that rotates the ball screw.

The above-described frame holding unit 306 is supported by the arm 318 so as to be vertically invertible, and a motor 320 that vertically inverts the frame holding unit 306 is attached to the arm 318. The frame holding unit 306 in the embodiment depicted in the figures includes a board 324 rotatably supported by the arm 318 via a pair of rotary shafts 322 and a plurality of suction pads 326 attached to one surface of the board 324. Each suction pad 326 is connected to a suction source (not depicted). In addition, one rotary shaft 322 is coupled to the motor 320.

The inverting mechanism 308 sucks and holds the lower surface of the frame 64 of the no-ring unit U' supported by the second raising and lowering table 272 by the suction pads 326 in a state in which the suction pads 326 are oriented upward. The inverting mechanism 308 thus receives the no-ring unit U' from the second raising and lowering table 272. In addition, the inverting mechanism 308 directs the top surface 4a of the wafer 4 upward by inverting the frame holding unit 306 by the motor 320, and thereafter moves the no-ring unit U' held by the frame holding unit 306 toward the frame cassette table 200 by moving the Y-axis movable member 316.

Figure 20:
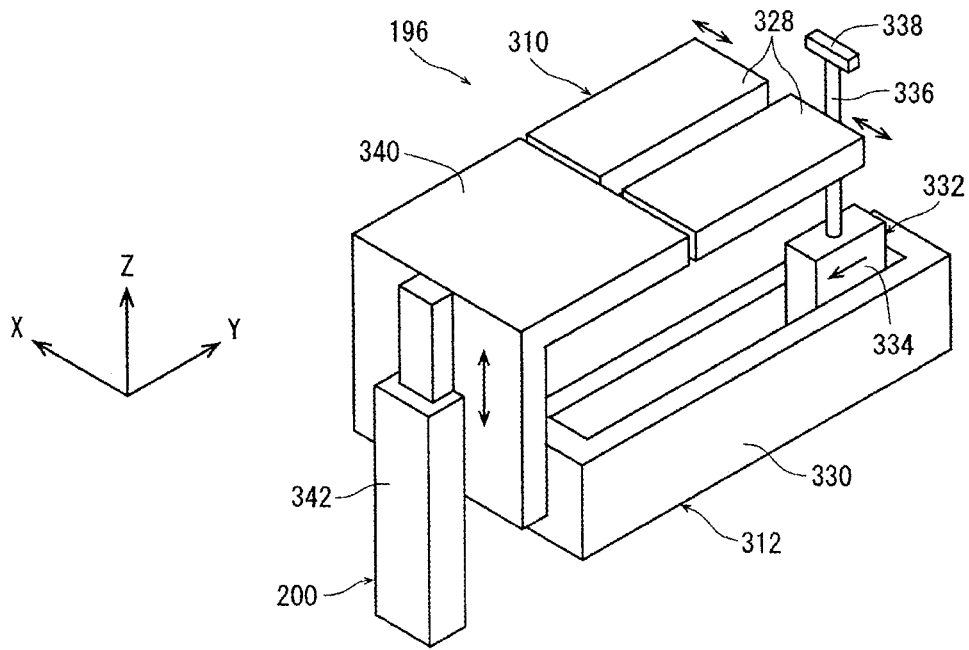
FIG. 20 is a perspective view of a no-ring unit supporting portion and a push-in unit of the no-ring unit unloading mechanism depicted in FIG. 1.

As depicted in FIG. 20, the no-ring unit supporting unit 310 in the embodiment depicted in the figures includes a pair of support plates 328 supported so as to be movable in the X-axis direction via appropriate brackets (not depicted) and a distance adjusting mechanism (not depicted) for adjusting a distance in the X-axis direction between the pair of support plates 328. The distance adjusting mechanism can be formed by an appropriate actuator such as an air cylinder or an electric cylinder.

The pair of support plates 328 supporting the no-ring unit U' is fitted with a heater (not depicted). In a state in which the distance between the pair of support plates 328 is narrowed, the pair of support plates 328 heats the tape 96 of the no-ring unit U' by the heater, and thereby removes a slack or a wrinkle in the tape 96 which slack or wrinkle is caused by removing the reinforcing portion 24.

Continuing the description with reference to FIG. 20, the push-in unit 312 in the embodiment depicted in the figures includes a Y-axis guide member 330 extending in the Y-axis direction, a Y-axis movable member 332 supported by the Y-axis guide member 330 so as to be movable in the Y-axis direction, and a Y-axis feed mechanism (not depicted) that moves the Y-axis movable member 332 in the Y-axis direction. The Y-axis movable member 332 includes a base portion 334 supported by the Y-axis guide member 330, a column 336 extending upward from an upper surface of the base portion 334, and a pressing piece 338 attached to an upper end of the column 336. It suffices for the Y-axis feed mechanism of the push-in unit 312 to have a configuration including a ball screw coupled to the Y-axis movable member 332 and extending in the Y-axis direction and a motor that rotates the ball screw.

Figure 21:
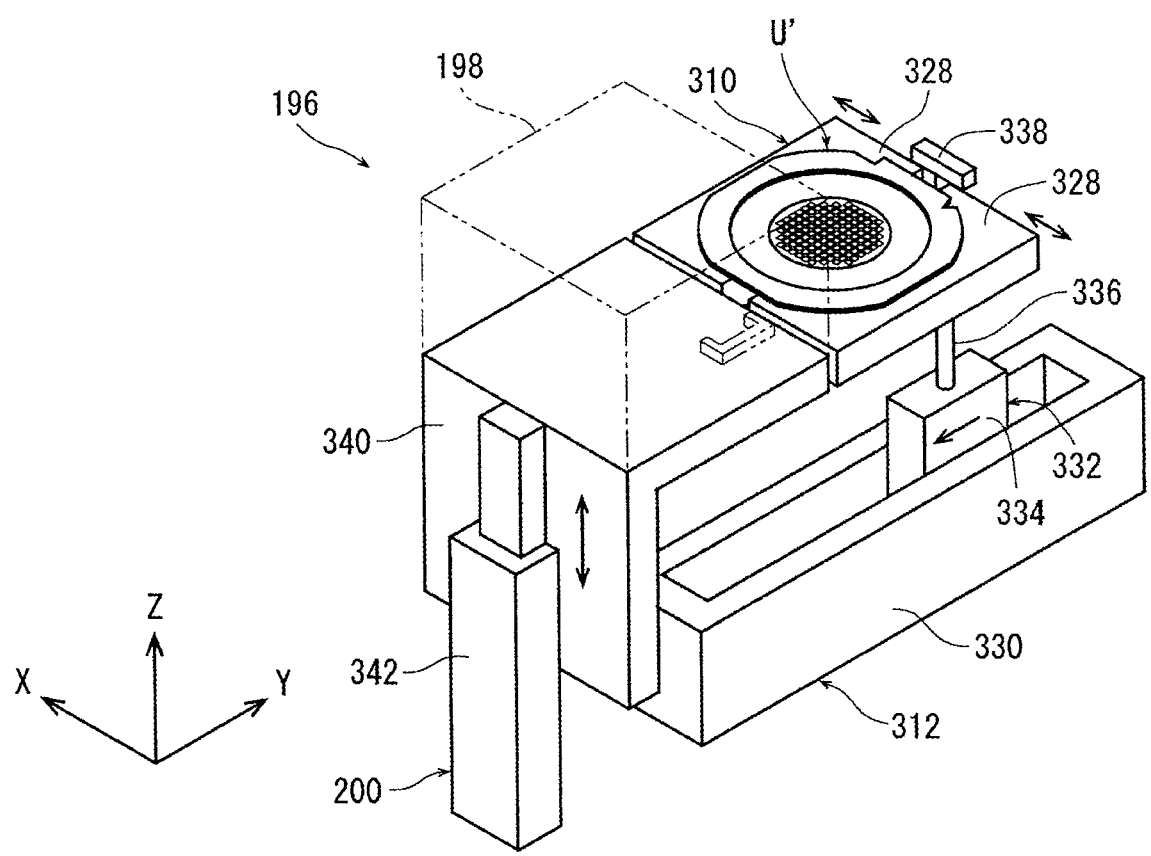
FIG. 21 is a perspective view depicting a state in which a no-ring unit housing step is performed.

As depicted in FIG. 21, the no-ring unit supporting unit 310 increases the distance between the pair of support plates 328 by the distance adjusting mechanism before receiving the no-ring unit U', and thereafter receives the no-ring unit U' held by the suction pads 326. Then, when the no-ring unit supporting unit 310 receives the no-ring unit U', the push-in unit 312 moves the Y-axis movable member 332 in the Y-axis direction by the Y-axis feed mechanism, and thereby advances and houses the no-ring unit U' supported by the no-ring unit supporting unit 310 into the frame cassette 198 mounted on the frame cassette table 200 by the pressing piece 338.

The frame cassette 198 depicted in FIG. 1 and FIG. 21 houses a plurality of no-ring units U' at intervals in the upward-downward direction in a state in which the top surfaces 4a of the wafers 4 are oriented upward. As depicted in FIG. 20 and FIG. 21, the frame cassette table 200 includes a mounting unit 340 on which the frame cassette 198 is mounted and a raising and lowering unit 342 that positions the mounting unit 340 at any height by raising or lowering the mounting unit 340. It suffices for the raising and lowering unit 342 to have a configuration including a ball screw coupled to the mounting unit 340 and extending in the Z-axis direction and a motor that rotates the ball screw.

Description will next be made of a processing method in which the processing apparatus 2 as described above is used to integrate the wafer 4 with the frame 64 by attaching the dicing tape 96 to the undersurface 4b of the wafer 4 having the ring-shaped reinforcing portion 24 formed in a projecting shape on a part of the undersurface 4b which part corresponds to the peripheral surplus region 20, and remove the ring-shaped reinforcing portion 24 from the wafer 4 by cutting the ring-shaped reinforcing portion 24.

In the embodiment depicted in the figures, first, as depicted in FIG. 1 and FIG. 3, performed is a wafer cassette mounting step which mounts the wafer cassette 6 housing a plurality of wafers 4 on the wafer cassette table 8. The wafer cassette 6 houses the plurality of wafers 4 at intervals in the upward-downward direction in a state in which the top surfaces 4a are oriented upward.

In addition, as depicted in FIG. 1 and FIG. 5, performed is a frame housing step which houses a plurality of ring-shaped frames 64 in which an opening portion 64a for housing a wafer 4 is formed into the frame housing mechanism 66. The frame housing step may be performed before the wafer cassette mounting step, or may be performed after the wafer cassette mounting step.

In the frame housing step, the raising and lowering plate 74 of the frame housing mechanism 66 is lowered to any position, thereafter the door 76 is opened while the handle 76a is gripped, and the plurality of frames 64 are housed in a stacked manner on the upper surface of the raising and lowering plate 74. In addition, a frame 64 at a top is positioned in such a position as to be unloadable by the frame unloading mechanism 68 by adjusting the height of the raising and lowering plate 74 as appropriate.

After the wafer cassette mounting step and the frame housing step are performed, performed is a wafer unloading step which unloads a wafer 4 from the wafer cassette 6 mounted on the wafer cassette table 8.

Making description with reference to FIG. 3, in the wafer unloading step, first, the Y-axis movable member 32 is positioned in the vicinity of the wafer cassette table 8 by actuating the Y-axis feed mechanism 34 of the wafer unloading mechanism 10. Next, the hand 44 having the air jetting ports 46 oriented upward is positioned on the undersurface 4b side (lower side) of the wafer 4 in the wafer cassette 6 by driving the transporting arm 42. When the hand 44 is positioned on the undersurface 4b side of the wafer 4, a gap is provided between the undersurface 4b of the wafer 4 and the hand 44, and each guide pin 48 is positioned outward in the radial direction.

Next, a negative pressure is generated on one surface side of the hand 44 on the basis of a Bernoulli effect by jetting a compressed air from the air jetting ports 46 of the hand 44, and the wafer 4 is thus sucked and supported by the hand 44 from the undersurface 4b side in a noncontact manner. Next, each guide pin 48 is moved inward in the radial direction, and thereby horizontal movement of the wafer 4 sucked and supported by the hand 44 is regulated by each guide pin 48. Then, the wafer 4 sucked and supported by the hand 44 is unloaded from the wafer cassette 6 by moving the Y-axis movable member 32 and the transporting arm 42 of the wafer unloading mechanism 10.

After the wafer unloading step is performed, there is preferably performed a notch detecting step which detects the position of the notch 26 of the wafer 4. In the notch detecting step, as depicted in FIG. 4, the outer circumference of the wafer 4 sucked and supported by the hand 44 is positioned between the light emitting element 52 and the light receiving element 54 of the notch detector 50. Next, the position of the notch 26 of the wafer 4 is detected by rotating the wafer 4 by the driving source via the guide pin 48. Thus, the orientation of the wafer 4 can be adjusted to any orientation.

After the notch detecting step is performed, performed is a wafer supporting step which supports, by the wafer table 12, the top surface 4a side of the wafer 4 unloaded by the wafer unloading mechanism 10.

Making description with reference to FIG. 3, in the wafer supporting step, first, the top surface 4a of the wafer 4 is oriented downward by vertically inverting the hand 44 of the wafer unloading mechanism 10. Next, the peripheral surplus region 20 of the top surface 4a of the wafer 4 sucked and supported by the hand 44 is brought into contact with the annular supporting portion 56 of the wafer table 12 by moving the Y-axis movable member 32 and the transporting arm 42 of the wafer unloading mechanism 10. At this time, the device region 18 of the top surface 4a of the wafer 4 is located on the recess 62 of the wafer table 12. Thus, the devices 14 and the wafer table 12 do not come into contact with each other, so that damage to the devices 14 is prevented.

Next, a suction force is generated in each suction hole 60 by actuating the suction source of the wafer table 12, and the peripheral surplus region 20 of the top surface 4a of the wafer 4 is thereby sucked and held. Next, the suction and support of the wafer 4 by the hand 44 is released, and the hand 44 is separated from the wafer table 12. The wafer 4 is thus transferred from the wafer unloading mechanism 10 to the wafer table 12. Because the wafer 4 transferred to the wafer table 12 is sucked and held by each suction hole 60, the position of the wafer 4 is not shifted.

In addition, after the wafer cassette mounting step and the frame housing step are performed, performed is a frame unloading step which unloads a frame 64 from the frame housing mechanism 66 in parallel with the wafer unloading step and the wafer supporting step.

Making description with reference to FIG. 5, in the frame unloading step, first, the suction pads 92 of the holding unit 88 are brought into contact with an upper surface of a frame 64 at the top which frame is housed in the frame housing mechanism 66 by moving the X-axis movable member 84 and the Z-axis movable member 86 of the frame unloading mechanism 68. Next, a suction force is generated in the suction pads 92 by actuating the suction source of the frame unloading mechanism 68, and the frame 64 at the top is thereby sucked and held by the suction pads 92. Then, the frame 64 at the top which frame is sucked and held by the suction pads 92 of the holding unit 88 is unloaded from the frame housing mechanism 66 by moving the X-axis movable member 84 and the Z-axis movable member 86 of the frame unloading mechanism 68.

After the frame unloading step is performed, performed is a frame supporting step which supports the frame 64 unloaded by the frame unloading mechanism 68 by the frame table 70.

Continuing the description with reference to FIG. 5, in the frame supporting step, first, the frame 64 sucked and held by the suction pads 92 is brought into contact with an upper surface of the frame table 70 by moving the X-axis movable member 84 and the Z-axis movable member 86 of the frame unloading mechanism 68. At this time, the frame table 70 is positioned at the lowered position (position indicated by a solid line in FIG. 5). Next, the frame 64 is mounted onto the frame table 70 by releasing the suction force of the suction pads 92 of the frame unloading mechanism 68. Then, the holding unit 88 is separated from above the frame table 70 by moving the X-axis movable member 84 and the Z-axis movable member 86 of the frame unloading mechanism 68.

After the frame supporting step is performed, performed is a tape attaching step which attaches the tape 96 to the frame 64.

Making description with reference to FIG. 6A and FIG. 6B, in the tape attaching step, first, before the frame table 70 is moved from the lowered position (position depicted in FIG. 6A) to the raised position (position depicted in FIG. 6B) at which the tape 96 can be attached to the frame 64, the tape 96 is extracted from the roll tape 96R, and the tape 96 from which the peeling paper 116 is peeled off is positioned above the frame table 70. Incidentally, the adhesive surface of the tape 96 located above the frame table 70 is oriented downward.

Next, the frame table 70 is raised to such a degree that the pressing roller 132 of the compression bonding unit 110 of the tape attaching mechanism 98 can press the tape 96 against the frame 64 from above. Then, the pressing roller 132 is rolled in the Y-axis direction while the pressing roller 132 presses the adhesive surface of the tape 96 against the frame 64. The tape 96 extracted from the roll tape 96R by the tape extracting unit 108 can thereby be compression-bonded to the frame 64.

Next, the cutter 144 and the pressing roller 146 of the cutting unit 112 of the tape attaching mechanism 98 are lowered, the cutter 144 is pressed against the tape 96 on the frame 64, and the frame 64 is pressed by the pressing roller 146 from above the tape 96. Next, the cutter 144 and the pressing roller 146 are moved so as to describe a circle along the frame 64 by rotating the arm piece 140 by the motor 138. The tape 96 extending off the outer circumference of the frame 64 can thereby be cut along the frame 64. In addition, because the pressing roller 146 presses the frame 64 from above the tape 96, positional displacement of the frame 64 and the tape 96 is prevented while the tape 96 is cut. Incidentally, the already used tape 96 in which a circular opening portion 120 is formed is wound by the tape winding unit 106.

After the tape attaching step is performed, performed is a tape-attached frame transporting step which transports the frame 64 to which the tape 96 is attached to the wafer table 12, positions the opening portion 64a of the frame 64 at the undersurface 4b of the wafer 4 supported by the wafer table 12, and mounts the tape-attached frame 64' on the wafer table 12.

In the tape-attached frame transporting step, first, the frame table 70 is moved from the raised position to the lowered position. Next, the Y-axis movable member 150 and the Z-axis movable member 152 of the tape-attached frame transporting mechanism 100 (see FIG. 5) are moved to bring each suction pad 158 of the holding unit 154 of the tape-attached frame transporting mechanism 100 into contact with the upper surface of the tape-attached frame 64' (see FIG. 7) supported by the frame table 70 in a state in which the adhesive surface of the tape 96 is oriented downward.

Next, a suction force is generated in the suction pads 158 by actuating the suction source of the tape-attached frame transporting mechanism 100, and thereby the upper surface of the tape-attached frame 64' is sucked and held by the suction pads 158. Next, the tape-attached frame 64' sucked and held by the suction pads 158 is unloaded from the frame table 70 by moving the Y-axis movable member 150 and the Z-axis movable member 152 of the tape-attached frame transporting mechanism 100.

Next, the tape-attached frame 64' sucked and held by suction pads 158 of the tape-attached frame transporting mechanism 100 is transported to the wafer table 12. As depicted in FIG. 7, the opening portion 64a of the frame 64 is positioned at the undersurface 4b of the wafer 4 supported by the wafer table 12, and the tape-attached frame 64' is brought into contact with the frame supporting portion 58 of the wafer table 12. At this time, the adhesive surface of the tape 96 of the tape-attached frame 64' is oriented downward, and the undersurface 4b of the wafer 4 is oriented upward and faces the adhesive surface of the tape 96.

Next, the suction force of the suction pads 158 of the tape-attached frame transporting mechanism 100 is released, and thereby the tape-attached frame 64' is mounted on the frame supporting portion 58 of the wafer table 12. Then, the holding unit 154 is separated from above the wafer table 12 by moving the Y-axis movable member 150 and the Z-axis movable member 152 of the tape-attached frame transporting mechanism 100.

After the tape-attached frame transporting step is performed, performed is a tape compression-bonding step which compression-bonds the tape 96 of the tape-attached frame 64' to the undersurface 4b of the wafer 4.

Figure 8:
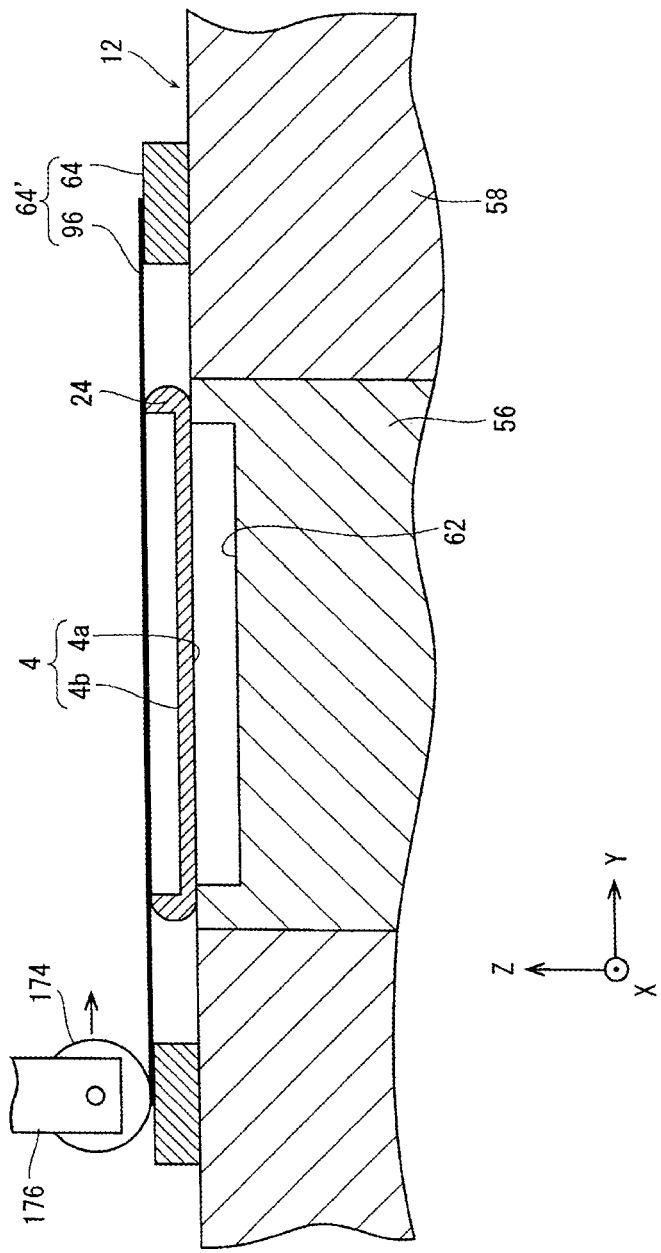
FIG. 8 is a sectional view depicting a state in which pressing of a tape by a pressing roller is started in a tape compression-bonding step.
Figure 9:
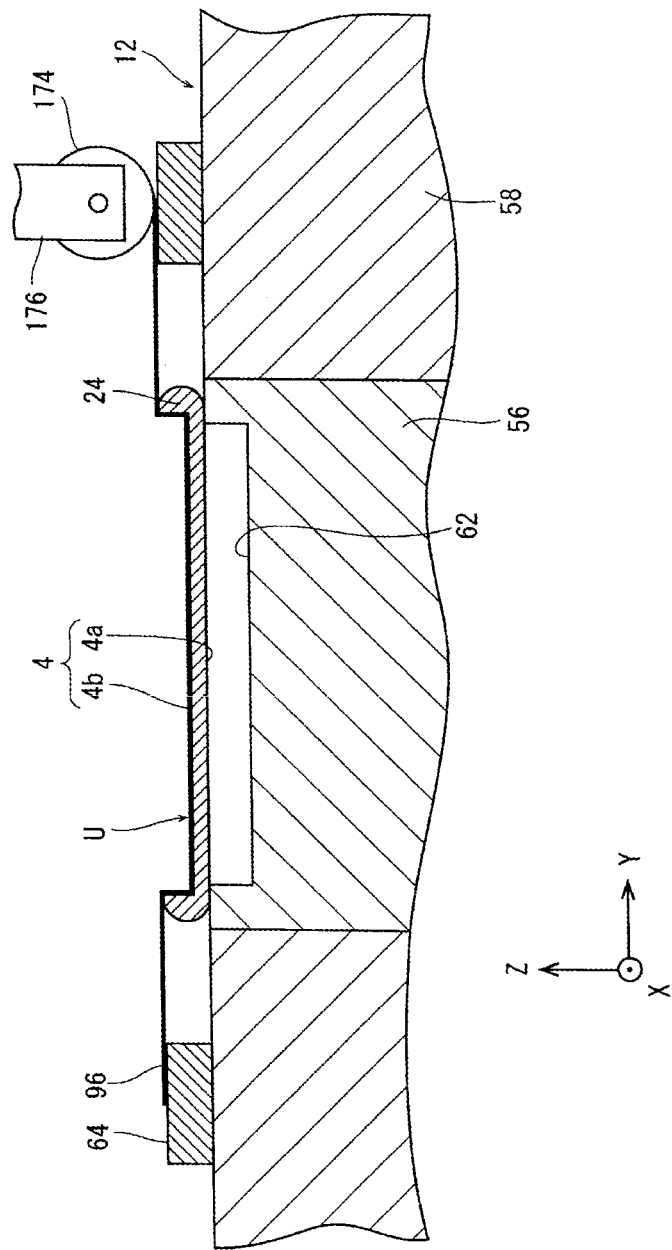
FIG. 9 is a sectional view depicting a state in which the pressing of the tape by the pressing roller is ended in the tape compression-bonding step.

Making description with reference to FIGS. 7 to 9, in the tape compression-bonding step, first, the raising and lowering mechanism 164 of the tape compression-bonding mechanism 102 lowers the upper chamber 160, and brings the lower end of the side wall 172 of the upper chamber 160 into contact with the upper end of the side wall 186 of the lower chamber 162. Consequently, the upper chamber 160 and the lower chamber 162 are set in the closed state, and the pressing roller 174 is brought into contact with the tape-attached frame 64'. Then, as depicted in FIG. 8, an upper end of the ring-shaped reinforcing portion 24 of the wafer 4 adheres to the adhesive surface of the tape 96 of the tape-attached frame 64'.

Next, the inside of the upper chamber 160 and the lower chamber 162 is evacuated by actuating the vacuum unit 166 in a state in which the atmosphere opening unit 168 of the tape compression-bonding mechanism 102 is closed. Next, as depicted in FIG. 8 and FIG. 9, the tape 96 is compression-bonded to the undersurface 4b of the wafer 4 by rolling the pressing roller 174 of the tape compression-bonding mechanism 102 in the Y-axis direction. A frame unit U in which the undersurface 4b of the wafer 4 and the tape 96 are compression-bonded to each other can thereby be produced. Next, the atmosphere opening unit 168 is opened, and the atmospheric pressure makes the tape 96 closely adhere to the undersurface 4b of the wafer 4 along the base of the ring-shaped reinforcing portion 24. Then, the raising and lowering mechanism 164 raises the upper chamber 160.

Incidentally, the suction force applied to the wafer 4 by the wafer table 12 is lost by evacuating the inside of the upper chamber 160 and the lower chamber 162. However, the position of the wafer 4 is not shifted in the tape compression-bonding step because the upper end of the ring-shaped reinforcing portion 24 of the wafer 4 adheres to the adhesive surface of the tape 96 of the tape-attached frame 64' when the upper chamber 160 and the lower chamber 162 are set in the closed state.

After the tape compression-bonding step is performed, performed is a frame unit unloading step which unloads the frame unit U in which the tape 96 of the tape-attached frame 64' and the undersurface 4b of the wafer 4 are compression-bonded to each other from the wafer table 12.

Making description with reference to FIG. 5, in the frame unit unloading step, first, the transporting unit 206 of the frame unit unloading mechanism 192 is actuated to bring the lower surface of the suction piece 210 of the wafer holding unit 202a of the frame unit holding unit 202 into contact with the tape 96 on the undersurface 4b side of the wafer 4, and bring the suction pads 214 of the frame holding unit 202b into contact with the frame 64.

Next, a suction force is generated in the suction piece 210 of the wafer holding unit 202a and the suction pads 214 of the frame holding unit 202b. Consequently, the suction piece 210 of the wafer holding unit 202a sucks and holds the wafer 4 from the undersurface 4b side (tape 96 side), and the suction pads 214 of the frame holding unit 202b suck and hold the frame 64. Next, the suction and holding of the wafer 4 by the wafer table 12 is released. Then, the frame unit U held by the frame unit holding unit 202 is unloaded from the wafer table 12 by actuating the transporting unit 206.

After the frame unit unloading step is performed, performed is a temporary placing step which makes the center of the wafer 4 coincide with the center of the temporary placement table 204, and temporarily places the frame unit U on the temporary placement table 204.

Making description with reference to FIG. 10, in the temporary placing step, first, the frame unit U held by the frame unit holding unit 202 is positioned above the imaging unit 224. Next, the transporting unit 206 constituting the two-dimensional moving mechanism of the frame unit unloading mechanism 192 is actuated, and the imaging unit 224 images at least three positions of the periphery of the wafer 4 of the frame unit U held by the frame unit holding unit 202. The coordinates of at least three points of the periphery of the wafer 4 are thereby measured. Next, the central coordinates of the wafer 4 are obtained on the basis of the measured coordinates of the three points.

Next, the transporting unit 206 is actuated to position the center of the wafer 4 at the center of the annular supporting portion 226 of the temporary placement table 204, bring the peripheral surplus region 20 of the top surface 4a of the wafer 4 into contact with an upper surface of the annular supporting portion 226 of the temporary placement table 204, and bring the lower surface of the frame 64 into contact with an upper surface of the frame supporting portion 228 of the temporary placement table 204. At this time, though the top surface 4a of the wafer 4 is oriented downward, the device region 18 is located on the recess 230 of the temporary placement table 204. Thus, the devices 14 and the temporary placement table 204 do not come into contact with each other, so that damage to the devices 14 is prevented.

Next, the suction and holding of the wafer 4 by the wafer holding unit 202a is released, and the suction and holding of the frame 64 by the frame holding unit 202b is released. The frame unit U is thereby transferred from the frame unit unloading mechanism 192 to the temporary placement table 204. Next, the heater of the frame supporting portion 228 is actuated, and the heater heats the tape 96 of the frame unit U temporarily placed on the temporary placement table 204. Consequently, the tape 96 is softened, and the tape 96 closely adheres to the base of the ring-shaped reinforcing portion 24 of the wafer 4.

After the temporary placing step is performed, performed is a reinforcing portion removing step which cuts and removes the ring-shaped reinforcing portion 24 from the wafer 4 of the frame unit U unloaded by the frame unit unloading mechanism 192.

Figure 12:
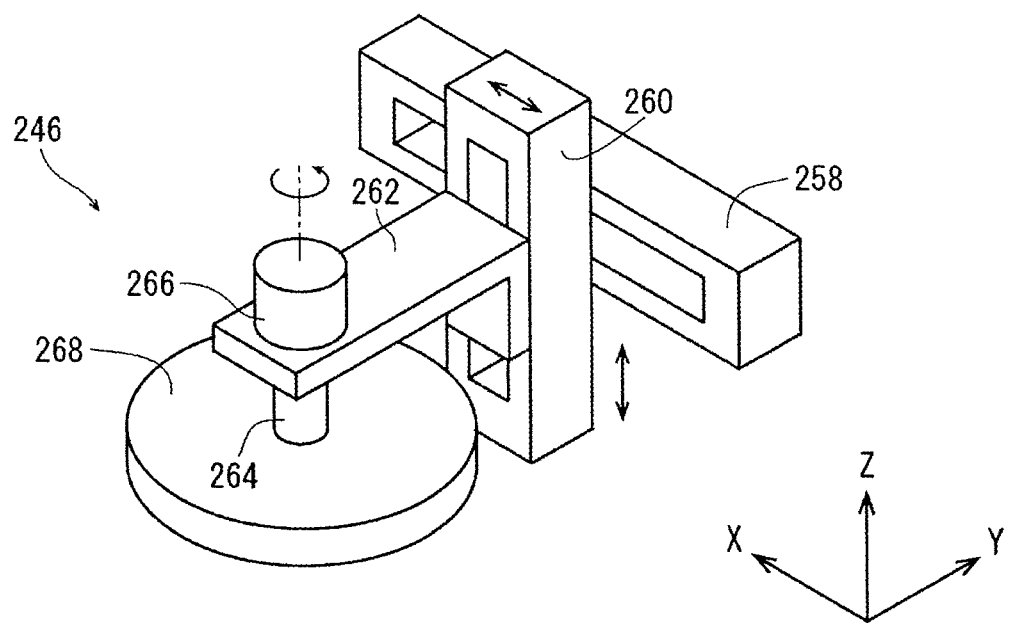
FIG. 12 is a perspective view of a first raising and lowering table of the reinforcing portion removing mechanism depicted in FIG. 1.

Making description with reference to FIG. 1, FIG. 10, and FIG. 12, in the reinforcing portion removing step, first, the lower surface of the suction piece 268 is brought into contact with the upper surface of the frame 64 of the frame unit U temporarily placed on the temporary placement table 204 by moving the X-axis movable member 260 and the Z-axis movable member 262 of the first raising and lowering table 246 of the reinforcing portion removing mechanism 194. Next, the part of the frame 64 of the frame unit U is sucked and held by generating a suction force in each suction hole of the suction piece 268 of the first raising and lowering table 246.

Next, the X-axis movable member 260 and the Z-axis movable member 262 of the first raising and lowering table 246 are actuated, and as depicted in FIG. 11, the frame unit U sucked and held by the suction piece 268 is positioned above the laser beam irradiating unit 244. Next, a condensing point of the laser beam LB is positioned at the base of the ring-shaped reinforcing portion 24 of the wafer 4 of the frame unit U.

Next, the base of the ring-shaped reinforcing portion 24 of the wafer 4 is irradiated with the laser beam LB while the motor 266 of the first raising and lowering table 246 rotates the suction piece 268 and the frame unit U. Consequently, a ring-shaped cutting groove 256 can be formed by performing ablation processing on the base of the ring-shaped reinforcing portion 24 of the wafer 4. In addition, when the wafer 4 is irradiated with the laser beam LB, a suction force is generated in the suction nozzle 254 by actuating the suction source of the laser beam irradiating unit 244, and the suction nozzle 254 sucks debris produced by the ablation processing.

Next, the X-axis movable member 260 and the Z-axis movable member 262 of the first raising and lowering table 246 are moved to bring the peripheral surplus region 20 on the top surface 4a of the wafer 4 of the frame unit U sucked and held by the suction piece 268 into contact with the upper surface of the annular supporting portion 226 of the temporary placement table 204, and bring the lower surface of the frame 64 into contact with the upper surface of the frame supporting portion 228 of the temporary placement table 204. Next, the suction force of the suction piece 268 of the first raising and lowering table 246 is released. The frame unit U is thus transferred from the first raising and lowering table 246 to the temporary placement table 204.

Next, the temporary placement table transporting unit 232 positions the temporary placement table 204 receiving the frame unit U below the separating unit 248 of the reinforcing portion removing mechanism 194 (see FIG. 10). Incidentally, at this time, the belt conveyor 300 of the discarding unit 276 is positioned at the standby position in advance. Next, the second raising and lowering table 272 of the separating unit 248 is lowered, and thereby a lower surface of the second raising and lowering table 272 is brought into contact with the tape 96 on the undersurface 4b part of the wafer 4. Next, a suction force is generated in the lower surface of the second raising and lowering table 272, and as depicted in FIG. 16, the table head 287 of the second raising and lowering table 272 thereby sucks and holds the inside of the wafer 4 of the frame unit U in a state in which the ring-shaped reinforcing portion 24 is exposed on the periphery.

Next, the frame unit U is separated from the temporary placement table 204 by raising the second raising and lowering table 272 sucking and holding the wafer 4 of the frame unit U, and the temporary placement table 204 is moved to a position below the first raising and lowering table 246. Next, as depicted in FIG. 17, the tops 402 having wedges are made to act on the periphery of the ring-shaped reinforcing portion 24 by moving the movable pieces 288 by the feed mechanisms 290, and moving the supporting boards 400 by the Z-axis feed mechanisms 294. The wedges of the tops 402 are positioned between the tape 96 and the reinforcing portion 24, and the frame 64 is supported by the spherical bodies 404b of the frame supporting units 404. In addition, the belt conveyor 300 of the discarding unit 276 is positioned from the standby position to the collecting position.

Next, the adhesive force of the tape 96 adhering to the ring-shaped reinforcing portion 24 is reduced by applying ultraviolet rays from the pair of ultraviolet ray irradiating units 270, and the motor 284 rotates the frame unit U together with the second raising and lowering table 272 with respect to the separator 274. In addition, an ionized air is blown from the ionizer 406 to the frame unit U. Consequently, as depicted in FIG. 18, the ring-shaped reinforcing portion 24 can be separated from the frame unit U, and static electricity occurring when the reinforcing portion 24 is separated does not remain in the frame unit U. The reinforcing portion 24 dropped from the frame unit U is transported and collected into the dust box 302 by the belt conveyor 300. Incidentally, the separator 274 may be rotated with respect to the frame unit U when the reinforcing portion 24 is separated.

After the reinforcing portion removing step is performed, performed is a no-ring unit unloading step which unloads the no-ring unit U' from which the ring-shaped reinforcing portion 24 is removed from the reinforcing portion removing mechanism 194.

In the no-ring unit unloading step, first, the belt conveyor 300 of the discarding unit 276 of the reinforcing portion removing mechanism 194 is positioned from the collecting position to the standby position. Next, the frame holding unit 306 of the inverting mechanism 308 (see FIG. 19) of the no-ring unit unloading mechanism 196 is positioned below the no-ring unit U' sucked and held by the second raising and lowering table 272.

Next, the arm 318 is raised in a state in which the suction pads 326 of the frame holding unit 306 are oriented upward, and thereby the suction pads 326 of the frame holding unit 306 are brought into contact with the lower surface side of the frame 64 of the no-ring unit U' that is supported by the second raising and lowering table 272 and in which the top surface 4a of the wafer 4 is oriented downward.

Next, a suction force is generated in the suction pads 326 of the frame holding unit 306, and the suction pads 326 thereby suck and hold the frame 64 of the no-ring unit U'. Next, the suction and holding of the no-ring unit U' by the second raising and lowering table 272 is released. The no-ring unit U' is thereby transferred from the second raising and lowering table 272 of the reinforcing portion removing mechanism 194 to the frame holding unit 306 of the no-ring unit unloading mechanism 196.

After the no-ring unit unloading step is performed, performed is a no-ring unit housing step which houses the no-ring unit U' unloaded by the no-ring unit unloading mechanism 196.

In the no-ring unit housing step, first, the no-ring unit U' sucked and held by the frame holding unit 306 is vertically inverted by vertical inversion of the inverting mechanism 308 of the no-ring unit unloading mechanism 196. Consequently, the no-ring unit U' is positioned below the frame holding unit 306, and the top surface 4a of the wafer 4 is oriented upward.

Next, the no-ring unit U' is brought into contact with an upper surfaces of the pair of support plates 328 of the no-ring unit supporting unit 310 by moving the Y-axis movable member 316 and the arm 318 of the inverting mechanism 308. At this time, the distance between the pair of support plates 328 is decreased by the distance adjusting mechanism, and the pair of support plates 328 is in close contact with each other. Next, the suction and holding of the no-ring unit U' by the frame holding unit 306 is released, and thereby the no-ring unit U' is mounted on the pair of support plates 328. Next, the tape 96 of the no-ring unit U' is heated by actuating the heater fitted to each of the support plates 328. A warp or a wrinkle in the tape 96 which warp or wrinkle is caused by removing the reinforcing portion 24 is thereby removed. Then, the frame holding unit 306 sucks and holds the no-ring unit U' again and raises the no-ring unit U'.

Next, after the distance adjusting mechanism increases the distance between the pair of support plates 328, the no-ring unit U' is mounted on the upper surfaces of the support plates 328. Then, as depicted in FIG. 21, the pressing piece 338 of the push-in unit 312 pushes the no-ring unit U' supported by the no-ring unit supporting unit 310, and thereby advances and houses the no-ring unit U' into the frame cassette 198 placed on the frame cassette table 200.

As described above, the processing apparatus 2 in the embodiment depicted in the figures facilitates work of integrating the wafer 4 with the frame 64 by attaching the dicing tape 96 to the undersurface 4b of the wafer 4 having the ring-shaped reinforcing portion 24 formed in a projecting shape on the part of the undersurface 4b which part corresponds to the peripheral surplus region 20, and facilitates cutting the ring-shaped reinforcing portion 24 and removing the ring-shaped reinforcing portion 24 from the wafer 4. Excellent productivity is thus achieved.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus for removing a ring-shaped reinforcing portion in a projecting shape from a wafer having the reinforcing portion formed in a projecting shape on an undersurface part corresponding to a peripheral surplus region, the processing apparatus comprising:
   a wafer cassette table mounted with a wafer cassette housing a plurality of wafers;
   a wafer unloading mechanism configured to unload the wafer from the wafer cassette mounted on the wafer cassette table;
   a wafer table configured to support a top surface side of the wafer unloaded by the wafer unloading mechanism;
   a frame housing mechanism configured to house a plurality of ring-shaped frames in which an opening portion for housing the wafer is formed;
   a frame unloading mechanism configured to unload a frame from the frame housing mechanism;
   a frame table configured to support the frame unloaded by the frame unloading mechanism;
   a tape attaching mechanism disposed above the frame table and configured to attach a tape to the frame;
   a tape-attached frame transporting mechanism configured to transport the frame to which the tape is attached to the wafer table, position the opening portion of the frame at the undersurface of the wafer supported by the wafer table, and mount the tape-attached frame on the wafer table;
   a tape compression-bonding mechanism configured to compression-bond the tape of the tape-attached frame to the undersurface of the wafer;
   a frame unit unloading mechanism configured to unload, from the wafer table, a frame unit in which the tape of the tape-attached frame and the undersurface of the wafer are compression-bonded to each other by the tape compression-bonding mechanism, and temporarily place the frame unit on a temporary placement table;
   a reinforcing portion removing mechanism configured to cut and remove the ring-shaped reinforcing portion from the wafer of the frame unit mounted on the temporary placement table;
   a no-ring unit unloading mechanism configured to unload the no-ring unit from which the ring-shaped reinforcing portion is removed from the reinforcing portion removing mechanism; and
   a frame cassette table mounted with a frame cassette configured to house the no-ring unit unloaded by the no-ring unit unloading mechanism;
   the reinforcing portion removing mechanism including a laser beam irradiating unit configured to form a cutting groove by applying a laser beam to a base of the ring-shaped reinforcing portion formed on a periphery of the wafer, a first raising and lowering table configured to hold and raise the frame unit temporarily placed on the temporary placement table, and position the frame unit at the laser beam irradiating unit, and a separating unit configured to separate the ring-shaped reinforcing portion from the cutting groove;
   the separating unit including an ultraviolet ray irradiating unit configured to reduce an adhesive force of the tape by irradiating a tape part corresponding to the cutting groove with an ultraviolet ray, a second raising and lowering table configured to suck and hold an inside of the wafer while exposing the ring-shaped reinforcing portion to a periphery of the second raising and lowering table, a separator configured to separate the ring-shaped reinforcing portion by making tops having a wedge act on a periphery of the ring-shaped reinforcing portion, and a discarding unit onto which the separated ring-shaped reinforcing portion is discarded, wherein:
   the second raising and lowering table includes two kinds or more of table heads having an outside diameter corresponding to an inside diameter of the reinforcing portion of the wafer, and a table head is detachably fitted to a raising and lowering mechanism,
   the separating unit includes a detector configured to detect whether or not a kind of table head input to a control unit coincides with a kind of table head actually fitted, and
   the detector detects whether or not the outside diameter of the table head which outside diameter is obtained by bringing the tops of the separator into contact with a periphery of the table head coincides with the outside diameter of the table head which outside diameter is input to the control unit.

2. The processing apparatus according to claim 1, further comprising:
   frame supporting units which are adjacent to the tops of the separating unit and support the frame.

3. The processing apparatus according to claim 2, wherein the frame supporting units each have a rotatable spherical body.

4. The processing apparatus according to claim 1, wherein an ionizer is disposed so as to be adjacent to tops of the separating unit, and removes static electricity from the frame unit.

5. A processing apparatus for removing a ring-shaped reinforcing portion in a projecting shape from a wafer having the reinforcing portion formed in a projecting shape on an undersurface part corresponding to a peripheral surplus region, the processing apparatus comprising:
- a wafer cassette table mounted with a wafer cassette housing a plurality of wafers;
- a wafer unloading mechanism configured to unload the wafer from the wafer cassette mounted on the wafer cassette table;
- a wafer table configured to support a top surface side of the wafer unloaded by the wafer unloading mechanism;
- a frame housing mechanism configured to house a plurality of ring-shaped frames in which an opening portion for housing the wafer is formed;
- a frame unloading mechanism configured to unload a frame from the frame housing mechanism;
- a frame table configured to support the frame unloaded by the frame unloading mechanism;
- a tape attaching mechanism disposed above the frame table and configured to attach a tape to the frame;
- a tape-attached frame transporting mechanism configured to transport the frame to which the tape is attached to the wafer table, position the opening portion of the frame at the undersurface of the wafer supported by the wafer table, and mount the tape-attached frame on the wafer table;
- a tape compression-bonding mechanism configured to compression-bond the tape of the tape-attached frame to the undersurface of the wafer;
- a frame unit unloading mechanism configured to unload, from the wafer table, a frame unit in which the tape of the tape-attached frame and the undersurface of the wafer are compression-bonded to each other by the tape compression-bonding mechanism, and temporarily place the frame unit on a temporary placement table;
- a reinforcing portion removing mechanism configured to cut and remove the ring-shaped reinforcing portion from the wafer of the frame unit mounted on the temporary placement table;
- a no-ring unit unloading mechanism configured to unload the no-ring unit from which the ring-shaped reinforcing portion is removed from the reinforcing portion removing mechanism;
- a frame cassette table mounted with a frame cassette configured to house the no-ring unit unloaded by the no-ring unit unloading mechanism;
- the reinforcing portion removing mechanism including a laser beam irradiating unit configured to form a cutting groove by applying a laser beam to a base of the ring-shaped reinforcing portion formed on a periphery of the wafer, a first raising and lowering table configured to hold and raise the frame unit temporarily placed on the temporary placement table, and position the frame unit at the laser beam irradiating unit, and a separating unit configured to separate the ring-shaped reinforcing portion from the cutting groove; and
- the separating unit including an ultraviolet ray irradiating unit configured to reduce an adhesive force of the tape by irradiating a tape part corresponding to the cutting groove with an ultraviolet ray, a second raising and lowering table configured to suck and hold an inside of the wafer while exposing the ring-shaped reinforcing portion to a periphery of the second raising and lowering table, a separator configured to separate the ring-shaped reinforcing portion by making tops having a wedge act on a periphery of the ring-shaped reinforcing portion, and a discarding unit onto which the separated ring-shaped reinforcing portion is discarded, and the processing apparatus further comprising frame supporting units which are adjacent to the tops of the separating unit and support the frame.

6. A processing apparatus for removing a ring-shaped reinforcing portion in a projecting shape from a wafer having the reinforcing portion formed in a projecting shape on an undersurface part corresponding to a peripheral surplus region, the processing apparatus comprising:
- a wafer cassette table mounted with a wafer cassette housing a plurality of wafers;
- a wafer unloading mechanism configured to unload the wafer from the wafer cassette mounted on the wafer cassette table;
- a wafer table configured to support a top surface side of the wafer unloaded by the wafer unloading mechanism;
- a frame housing mechanism configured to house a plurality of ring-shaped frames in which an opening portion for housing the wafer is formed;
- a frame unloading mechanism configured to unload a frame from the frame housing mechanism;
- a frame table configured to support the frame unloaded by the frame unloading mechanism;
- a tape attaching mechanism disposed above the frame table and configured to attach a tape to the frame;
- a tape-attached frame transporting mechanism configured to transport the frame to which the tape is attached to the wafer table, position the opening portion of the frame at the undersurface of the wafer supported by the wafer table, and mount the tape-attached frame on the wafer table;
- a tape compression-bonding mechanism configured to compression-bond the tape of the tape-attached frame to the undersurface of the wafer;
- a frame unit unloading mechanism configured to unload, from the wafer table, a frame unit in which the tape of the tape-attached frame and the undersurface of the wafer are compression-bonded to each other by the tape compression-bonding mechanism, and temporarily place the frame unit on a temporary placement table;
- a reinforcing portion removing mechanism configured to cut and remove the ring-shaped reinforcing portion from the wafer of the frame unit mounted on the temporary placement table;
- a no-ring unit unloading mechanism configured to unload the no-ring unit from which the ring-shaped reinforcing portion is removed from the reinforcing portion removing mechanism; and
- a frame cassette table mounted with a frame cassette configured to house the no-ring unit unloaded by the no-ring unit unloading mechanism;
- the reinforcing portion removing mechanism including a laser beam irradiating unit configured to form a cutting groove by applying a laser beam to a base of the ring-shaped reinforcing portion formed on a periphery of the wafer, a first raising and lowering table configured to hold and raise the frame unit temporarily placed on the temporary placement table, and position the frame unit at the laser beam irradiating unit, and a separating unit configured to separate the ring-shaped reinforcing portion from the cutting groove;
- the separating unit including an ultraviolet ray irradiating unit configured to reduce an adhesive force of the tape by irradiating a tape part corresponding to the cutting groove with an ultraviolet ray, a second raising and lowering table configured to suck and hold an inside of the wafer while exposing the ring-shaped reinforcing portion to a periphery of the second raising and lowering table, a separator configured to separate the ring-shaped reinforcing portion by making tops having a wedge act on a periphery of the ring-shaped reinforcing portion, and a discarding unit onto which the separated ring-shaped reinforcing portion is discarded; and wherein an ionizer is disposed so as to be adjacent to tops of the separating unit, and removes static electricity from the frame unit.

* * * * *